United States Patent [19]

Ozaki et al.

[11] Patent Number: 5,409,762
[45] Date of Patent: Apr. 25, 1995

[54] ELECTRIC CONTACT MATERIALS, PRODUCTION METHODS THEREOF AND ELECTRIC CONTACTS USED THESE

[75] Inventors: Masanori Ozaki, Utsunomiya; Keiji Mashimo, Nikko, both of Japan

[73] Assignee: The Furukawa Electric Company, Ltd., Tokyo, Japan

[21] Appl. No.: 38,282

[22] Filed: Mar. 29, 1993

Related U.S. Application Data

[63] Continuation-in-part of Ser. No. 623,647, Dec. 21, 1990.

[30] Foreign Application Priority Data

| May 10, 1989 | [JP] | Japan | 1-116285 |
| May 17, 1989 | [JP] | Japan | 1-123670 |
| Oct. 6, 1989 | [JP] | Japan | 1-261857 |
| Feb. 14, 1990 | [JP] | Japan | 2-33180 |
| Feb. 14, 1990 | [JP] | Japan | 2-33181 |
| Feb. 14, 1990 | [JP] | Japan | 2-33182 |
| Feb. 20, 1990 | [JP] | Japan | 2-39186 |
| Mar. 2, 1990 | [JP] | Japan | 2-51084 |
| Apr. 16, 1990 | [JP] | Japan | 2-99553 |
| Apr. 16, 1990 | [JP] | Japan | 2-99554 |
| Apr. 17, 1990 | [JP] | Japan | 2-101064 |
| Apr. 17, 1990 | [JP] | Japan | 2-101065 |
| Apr. 17, 1990 | [JP] | Japan | 2-101066 |

[51] Int. Cl.$^6$ .................. H01H 1/02; H01R 13/02
[52] U.S. Cl. .................. 428/216; 200/268; 200/266; 428/336; 428/472; 428/698; 428/704
[58] Field of Search ............... 428/472, 698, 704, 216, 428/336; 200/268, 266

[56] References Cited

U.S. PATENT DOCUMENTS

| 4,405,849 | 9/1983 | Frame . |
| 4,680,438 | 7/1987 | Witting et al. . |
| 4,774,151 | 9/1988 | Cuomo et al. . |
| 4,904,542 | 2/1990 | Mroczkowski . |
| 4,933,520 | 6/1990 | Ohba et al. . |

FOREIGN PATENT DOCUMENTS

| 0088211 | 9/1983 | European Pat. Off. . |
| 2528255 | 2/1976 | Germany . |
| 58-164115 | 9/1983 | Japan . |
| 59-165315 | 9/1984 | Japan . |
| 61-68323 | 4/1986 | Japan . |
| 61-109212 | 5/1986 | Japan . |
| 61-109213 | 5/1986 | Japan . |
| 61-109214 | 5/1986 | Japan . |
| 61-109215 | 5/1986 | Japan . |
| 62-55814 | 3/1987 | Japan . |
| 1-21221 | 4/1989 | Japan . |
| 2130795 | 6/1984 | United Kingdom . |

*Primary Examiner*—Archene Turner
*Attorney, Agent, or Firm*—Oblon, Spivak, McClelland, Maier, & Neustadt

[57] ABSTRACT

The present invention provides inexpensive electric contact materials having higher hardness and higher melting point and being more excellent in the points of wear resistance and environmental resistance over the electric contact materials of Ag type, Au type, platinum group type, etc. having been used so far, production methods thereof and electric contacts used said contact materials.

In the electric contact materials of the invention, basically, a covering layer having at least one selected from transition metals of groups IVa (Ti, Zr, Hf, etc.), Va (V, Nb, Ta, etc.) and VIa (Cr, Mo, W, etc.) as a major ingredient is formed on the substrate as an electric contact in a thickness of 0.03 to 100 μm, and, if need be, a fixed intermediate layer is formed between said covering layer of electric contact and substrate or a fixed surface layer is formed on the outside of covering layer of electric contact, thus aiming at further improvement in the characteristics of contact.

Such covering layer of electric contact can be formed by chemical vaporization or physical vaporization such as plasma CVD, sputtering, ion assist vaporization, ion plating, laser beam sputtering or the like and, by making the conditions of these vaporizations appropriate, it is possible to produce the electric contact materials having excellent characteristics of contact.

3 Claims, 2 Drawing Sheets

ELECTRIC CONTACT MATERIALS, PRODUCTION METHODS THEREOF AND ELECTRIC CONTACTS USED THESE

This is a continuation-in-part of application Ser. No. 07/623,647, filed Dec. 21, 1990.

TECHNICAL FIELD

The present invention relates to low-cost electric contact materials having high hardness and high melting point and being excellent in the wear resistance, environmental resistance and high rigidity, production methods thereof and electric contacts used these. In particular, these materials are used for lead relay, lead switch, relay for communication instruments, relay for control, microswitch, keyboard switch, oscillating contact, etc.

TECHNICAL BACKGROUND

So far, for the small and medium-sized electric contacts, contact materials with good electroconductivity comprising gold, gold alloy, silver and silver alloy have been used because of low contacting force. With these contact materials, however, when the number of works of switching-on and -off increases, the exhaustion reaches the substrate metal because of low hardness (Hv 100–200) and low melting point (900°–1060° C.) resulting in the scattering of exhausted powder onto the surface of contact. Hence, the contacting resistance etc. increased leading to the instability. Moreover, the time-lag (poor restoration) was caused due to the adherence and locking of the surface of contact leading to a drawback of remarkably short life of contact. On the other hand, in the cases of lead switch etc., if using W, Mo, etc. being metals with high melting point from the reasons of low contacting pressure and difficulty in providing thick layer of contact, the increase in the contacting resistance cannot be prevented. So, plated contacts with noble metals such as Rh, Ru, etc. are broadly used.

However, the Rh contact has a drawback that the contacting resistance increases with organic gases containing in the atmosphere and organic gases previously adsorbed onto the surface. Moreover, it is impossible to give the plating onto easily oxidizable contact strips or lead pieces of Fe, Ni, etc. and it is required to plate intervening plated layers of Au, Ag, Cu, etc. For this reason, effective plating thickness decreases and the process becomes complicated on production leading to a drawback of high-processing price for contact.

DISCLOSURE OF THE INVENTION

As a result of extensive investigations in view of this situation, low-cost electric contact materials, wherein said drawbacks were solved and the life of contact and reliability were improved, production methods thereof and electric contacts used these have been developed according to the invention.

Namely, the first of the inventive materials is characterized in that a covering layer having at least one selected from carbides, nitrides, borides, silicides and aluminides of transition metals of groups IVa, Va and VIa as a major ingredient is formed on the substrate as an electric contact in a thickness of 0.03 to 100 μm.

Moreover, the second of the inventive materials is characterized in that, in the middle of substrate and 0.03 to 100 μm thick covering layer of electric contact being the outermost layer and having at least one selected from carbides, nitrides, borides, silicides and aluminides of transition metals of groups IVa, Va and VIa as a major ingredient, a not less than 0.1 μm thick intermediate layer having a composition of ABx (A: transition metal of group IVa, Va or VIa, B: carbon, nitrogen, boron, silicon or aluminum) and having a gradient composition of X=0 on the side of substrate and X=1 in cases of carbon and nitrogen, X=2 in cases of boron and silicon and X=3 in case of aluminum on the side of covering layer of electric contact is formed.

Furthermore, the third of the inventive materials is characterized in that an intermediate layer comprising soft metal is covered on the substrate in a thickness of not less than 0.01 μm and, thereon, a covering layer of electric contact having at least one selected from carbides, nitrides, borides, silicides and aluminides of transition metals of groups IVa, Va and VIa as a major ingredient is formed in a thickness of 0.03 to 100 μm.

And, as said intermediate layer comprising soft metal, use of a metal having at least one selected from Ag, Al, Au, Co, Cu, Fe, Mg, Ni, Pd, Pt, Sr, Cr and transition metals of groups IVa and Va as a major ingredient is effective, and, in this case, as the transition metal for forming the intermediate layer, use of the same kind of transition metal as that constituting carbide, nitride, boride, silicide or aluminide to be formed thereon is also effective.

Further, in both cases aforementioned, as the covering layer of electric contact, constitution of two or more layers layered the materials selected from carbides, nitrides, borides, silicides and aluminides of transition metals of groups IVa, Va and VIa brings about good effect.

Still more, the fourth of the inventive materials is characterized in that a 0.03 to 100 μm thick intermediate layer having at least one selected from carbides, nitrides, borides, silicides and aluminides of transition metals of groups IVa, Va and VIa as a major ingredient is provided on the substrate as an electric contact and, thereon, a not less than 0.01 μm thick surface layer comprising soft metal is formed. Also, in this case, use of a soft metal having at least one selected from Ag, Al, Au, Co, Cu, Fe, Mg, Ni, Pd, Pt, Sr, Cr and transition metals of groups IVa and Va as a major ingredient for surface layer is effective, and the layering of two or more layers of materials selected from carbides, nitrides, borides, silicides and aluminides of transition metals of groups IVa, Va and VIa is effective constitution as an intermediate layer. Preferably, the thickness of the surface layer is from 0.01–3 μm. Further, the hardness of the surface layer is lower than that of the intermediate layer, its specific resistance is preferably not more than 50 μΩ, and its melting point is preferably not less than 600° C.

And, as the transition metal of group IVa to be used for the inventive electric contact materials described above, one having at least one selected from Ti, Zr and Hf as a major ingredient is good, as the transition metal of group Va, one having at least one selected from V, Nb and Ta as a major ingredient is good, and, as the transition metal of group VIa, one having at least one selected from Cr, Mo and W as a major ingredient is good.

Next, the first of the production methods of the inventive electric contact materials is characterized in that said covering layer as the electric contact having at least one selected from carbides, nitrides, borides, silicides and aluminides of transition metals of groups IVa, Va and VIa as a major ingredient is formed by plasma CVD in a thickness of 0.03 to 100 μm, and, upon forming said covering layer by plasma CVD using said nitrides among those as raw materials, good results can be obtained when performing in such a way that, after the surface cleaning with ions or electrons, the plasma CVD is performed at a total pressure of 0.1 to 10 Torr while heating the substrate to 300° to 900° C. under an atmosphere flowing $N_2$ gas and chloride gas of transition metal of group IVa, Va or VIa as raw material gases so as the flow ratio of both ($N_2$ gas/chloride gas) to become not higher than 7 using hydrogen as a carrier gas.

Moreover, the second of the inventive production methods is characterized in that the covering layer as the electric contact having at least one selected from carbides, nitrides, borides, silicides and aluminides of transition metals of groups IVa, Va and VIa as a major ingredient is formed by sputtering in a thickness of 0.03 to 100 μm, and upon forming said covering layer by sputtering using said nitrides among those as raw materials, it is effective to perform in such a way that, after the surface cleaning with ions or electrons, the sputtering is performed at a total pressure of 1 to 50 mTorr while heating the substrate to 300° to 900° C. under an atmosphere flowing Ar and $N_2$ gas as gases in the reactor so as the flow ratio of both ($N_2$ gas/(Ar+$N_2$)gases) to become not lower than 0.1.

Furthermore, the third of the inventive production methods is characterized in that the covering layer as the electric contact having at least one selected from carbides, nitrides, borides, silicides and aluminides of transition metals of groups IVa, Va and VIa as a major ingredient is formed by ion assist vaporization in a thickness of 0.03 to 100 μm, and, upon forming said covering layer by ion assist vaporization using said nitrides among those as raw materials, it is effective to perform in such a way that, after the surface cleaning with ions or electrons, the ion assist vaporization is performed at a total pressure of $10^{-3}$ to $10^{-6}$ Torr and at a ratio of N atom to transition metal atom reaching the unit area of substrate per unit time of N/transition metal>2 while heating the substrate to 300° to 900° C. under an atmosphere being the gas pressure supplying to ion gun of $N_2$ gas/(Ar+$N_2$) gases$\geq$0.1.

Still more, the fourth of the inventive production methods is characterized in that the covering layer as the electric contact having at least one selected from carbides, nitrides, borides, silicides and aluminides of transition metals of groups IVa, Va and VIa as a major ingredient is formed by ion plating in a thickness of 0.03 to 100 μm, and, upon forming said covering layer by ion plating using said nitrides among those as raw materials, it is better to perform in such a way that, after the surface cleaning with ions or electrons, the ion plating is performed at a total pressure of $10^{-2}$ to $10^{-5}$ Torr and at a ratio of N atom to transition metal atom reaching the unit area of substrate per unit time of N/transition metal>2 while heating the substrate to 300° to 900° C. under an atmosphere being the gas pressure supplying to ionization mechanism of $N_2$ gas/(Ar+$N_2$) gases$\geq$0.1.

Still more, the fifth of the inventive production method is characterized in that the covering layer as the electric contact having at least one selected from carbides, nitrides, borides, silicides and aluminides of transition metals of groups IVa, Va and VIa as a major ingredient is formed by laser beam sputtering in a thickness of 0.03 to 100 μm, and, upon forming said covering layer by laser beam sputtering using said nitrides among those as raw materials, it is more advantageous to perform in such a way that, after the surface cleaning with ions or electrons, the laser beam sputtering is performed while heating the substrate to 300° to 900° C. under an atmosphere flowing Ar and $N_2$ gas as gases in the reactor so as the flow ratio of both ($N_2$ gas/(Ar+$N_2$)gases) to become not lower than 0.1.

Next, the first of the inventive electric contacts is characterized in that, in the electric contact comprising a pair of contacting portions A and B, each contacting portion is constituted by forming a film of contact having at least one of nitrides, carbides, silicides, diborides and aluminides of transition metals of groups IVa, Va and VIa as a major ingredient on the substrate in a thickness of 300 Å to 100 μm.

Moreover, the second of the inventive electric contacts is characterized in that, in the electric contact comprising a pair of contacting portions, one contacting portion A is constituted by forming a film of contact having at least one of nitrides, carbides, silicides, diborides and aluminides of transition metals of groups IVa, Va and VIa as a major ingredient on the substrate in a thickness of 300 Å to 100 μm and other contacting portion B is constituted by forming a film of contact having different material quality from that of contacting portion A on the substrate, and it is effective to form in a way that, as the contacting portion B, a single or multiplex-layered film of contact having at least one of nitrides, carbides, silicides, diborides and aluminides of transition metals of groups IVa, Va and VIa and being different from the material quality constituting the contacting portion A as a major ingredient is formed in a thickness of 300 Å to 100 μm, or in a way that, as the contacting portion B, a film of contact is formed with platinum group metal or alloy different from the material quality constituting the contacting portion A.

In following, foregoing each invention will be explained in detail.

In the first through third of the inventive materials, as described above, a covering layer of contact having at least one selected from carbides, nitrides, borides, silicides and aluminides of transition metals of groups IVa, Va and VIa as a major ingredient is formed on the substrate plate as an electric contact with or without intermediate layer intervened. Besides, conventionally, the covering layer could not be coated directly onto the substrate plate and needed to be coated intervening the covering layers such as Au, Ag, Cu, etc. In the invention, however, the direct coating onto substrate has become possible using vapor phase method, in particular, chemical vaporization method or physical vaporization method because of the surface cleaning such as ion bombard or electron shower after the precise polishing such as electrolytic polishing for smoothing the surface of substrate.

Here, carbides, nitrides, borides, silicides and aluminides of said transition metals of groups IVa, Va and VIa, for example, Ti, Zr, Hf, V, Nb, Ta, Cr, Mo and W have chemical stability, good environmental resistance (oxidation resistance, sulfurization resistance, etc.), high hardness and melting point, less transfer exhaustion, low wear and the like, thus they are excellent in the life for contact action and reliability and exhibit excellent properties as electric contacts.

With the inventive contact materials, if making the film thick, the contacting resistance would be 30 to 50 times as high as that of Au or Ag within a range of practical contact pressure (load of below 30 g) and the thermal conductivity would also become low as ceramics. For this reason, in order to make the contacting resistance and the thermal conductivity as an electric contact a practically problem-free extent, the film was made thin to be 300 Å to 100 μm. If the thickness of film is under 300 Å, good electroconductivity cannot be obtained to increase the contacting resistance, the wear resistance is insufficient to give no enough life of contact, and the oxidation resistance also becomes insufficient. If the thickness of film is over 100 μm, the contacting resistance increases to raise the temperature because of the roughening of surface due to coarsened crystals and the stabilized thermal conductivity cannot be obtained as well because of the thickening of film. Moreover, by layering the covering layer of contact in two or more layers, the decrease in pinholes in film and the compensation of characteristics become possible, thus effective. For the substrate of the inventive contact materials, Cu, Cu alloy, Fe alloy, Ni alloy, etc. are used.

Moreover, the intermediate layer shown in the second of the inventive materials is made so that the transition metal of covering layer of contact used is allowed to touch with the substrate, it inclines gradually to the composition of covering layer of contact, and it becomes finally the composition of covering layer of contact. In this way, metal elements tough mutually at the interface between substrate and intermediate layer and same compositions touch between intermediate layer and covering layer of contact leading to good affinity, improved adhesion and, at the same time, relaxation of stress in the covering layer of contact because of the gradient in the composition of intermediate layer. In addition, the difference in the thermal expansion between substrate and covering layer of contact is relaxed and the occurrence of cracks in the covering layer of contact and peeling-off can be prevented.

Furthermore, through the layerings of substrate and intermediate layer and intermediate layer and covering layer of contact, the occurrence of pinholes is prevented. This intermediate layer has good electroconductivity and no problem of heat generation and effectively works for the improvement in the characteristics of contact. Moreover, because the intermediate layer is constituted with softer material than contact material, this decreases the substantial hardness of the layer of contact material and decreases the contacting resistance, thus the kinetic energy on closing circuit is relaxed with soft metal to decrease the chattering. And, along with the decreased chattering, the number of generations of chattering arc also decreases to enhance the life of contact portion. In addition, the error actions on throwing-in also remarkably decrease to effect the improved reliability. Further, through the formation of intermediate layer on the surface of substrate, the surface becomes smooth and the covered surface of contact also becomes smooth leading to low and stabilized contacting resistance, which is preferable from the characteristics of contact. The thickness of said intermediate layer is desirable to be not less than 0.1 μm. This is because of that, if the thickness of film is under 0.1 μm, the distribution of gradient composition ends up to be disturbed and the development of said effects ends up to become low. The upper limit of thickness is determined by the production cost, size of contact and distance between contacts.

For the substrate, use of Cu, Cu alloy, Fe alloy, Ni alloy, etc. is preferable.

Furthermore, in the third of the invention, an intermediate layer having at least one selected from Ag, Al, Au, Co, Cr, Cu, Fe, Mg, Ni, Pd, Pt, Sr and transition metals of groups IVa and Va as a major ingredient is covered on the substrate in a thickness of not less than 0.01 μm, which improves the adhesion of covering layer of contact. As the intermediate layer, covering as it is may be good, but the diffusion treatment makes it more effective.

Through the provision of this intermediate layer, the stress in the covering layer of contact and the difference in the thermal expansion between substrate and covering layer of contact are relaxed together with the improved adhesion between substrate and covering layer of contact resulting in the prevention from cracks in the covering layer of contact and peeling-off. Moreover, because the intermediate layer is softer than the covering layer of contact, it decreases the substantial hardness of the layer of contact material and decreases the contacting resistance, thus the kinetic energy on closing circuit is relaxed at the intermediate layer to decrease the chattering. And, along with the decreased chattering, the number of generations of chattering are also decreases to enhance the life of contact portion. In addition, the error actions on throwing-in also remarkably decrease to improve the reliability. Further, through the formation of intermediate layer on the surface of substrate, the surface becomes smooth and the covered surface of contact also becomes smooth leading to low and stabilized contacting resistance, thus good characteristics of contact.

The reason why the thickness of intermediate layer was made to be not less than 0.01 μm is because of that, if the thickness of film is under 0.01 μm, lots of pinholes occur and the corrosion progresses from pinholes to increase the contacting resistance. The thickness of this intermediate layer is determined by the production cost, size of contact and distance between contacts.

And, the covering layer of contact has at least one selected from carbides, nitrides, borides, silicides and aluminides of transition metals of groups IVa, Va and VIa, for example, Ti, Zr, Hf, V, Nb, Ta, Cr, Mo and W as a major ingredient and exhibits good characteristics of excellent environmental resistance, high hardness and melting point, less transfer exhaustion and low wear. If layering two or more different layers on the intermediate layer, the decrease in the in-film pinholes of covering layer of contact and the compensation of characteristics become possible. This contact material exhibits good characteristics of excellent environmental resistance, high hardness and melting point, less transfer exhaustion and low wear.

Such covering layer of contact is formed by the chemical vaporization or physical vaporization and the thickness of film is made to be 0.03 to 100 μm. If the thickness of film is under 0.03 μm, good electroconductivity cannot be obtained to increase the contacting resistance, the wear resistance is insufficient to give no enough life of contact, and the oxidation resistance etc. also become insufficient. Moreover, if the thickness of film is over 100 μm, the contacting resistance increases to raise the temperature because of the roughening of surface due to coarsened crystals and the stabilized thermal conductivity cannot be obtained as well because of the thickening of film. Besides, for the substrate of the inventive contact materials, Cu, Cu alloy, Fe alloy, Ni alloy, etc. are used.

Moreover, in the third of the inventive materials, the transition metal of thin film of contact used is provided on the substrate as an intermediate layer, thereby the affinity between substrate and thin film of contact is improved, the difference in thermal expansivity is made small, and, at the same time, the misfit of lattice constant can be made small. In this way, metals touch mutually at the interface between substrate and intermediate layer and some kinds lie between intermediate layer and thin film of contact leading to good affinity, improved adhesion and simultaneously relaxation of stress due to the difference in thermal expansion to prevent the damage of thin film of contact. Also, through the layering of substrate/intermediate layer/thin film of contact, the occurrence of pinholes is prevented. Further, because the lattice constant of transition metal of intermediate layer is close to that of carbide, nitride and diboride of transition metal, the misfit becomes small to permit good control of crystals. This intermediate layer has good electroconductivity and no problem of heat generation etc. and effectively works from the characteristics of contact. For the substrate, Cu, Cu alloy, Fe alloy, etc. are used.

Further, in the fourth of the inventive materials, the substantial hardness of contact portion was decreased and the contacting resistance was stabilized by providing further with a layer of soft metal on the surface of said covering layer of electric contact for improving the points that, although the electric contact with good characteristics can be obtained by decreasing the thickness of film of nitrides, carbides, silicides, diborides and aluminides of transition metals of groups IVa, Va and VIa, for example, Ti, Zr, V, Hf, Nb, Ta, Cr, Mo and W as the covering layer of electric contact to 300 Å to 100 μm, the initial contacting resistance of electric contact formed with these materials is unstable and the absolute value is slightly higher over the contact made of noble metals. In this way, the kinetic energy of contact is exhausted to some extent on the surface layer, thus the chattering, which occurs by elastically leaping up the contact portion, decreases to enhance the life of contact. In addition, the error actions on throwing-in accompanying with chattering remarkably decrease to improve the reliability. Moreover, the increased contacting area results in a low and stabilized contacting resistance, thus the characteristics of contact become good. The reason why the thickness of film on the surface layer was made to be not less than 100 Å is because of that, if under 100 Å, defects of pinholes etc. are caused and the effects can hardly be seen.

As the material quality of this surface layer, at least one may be selected amoung Ag, Au, Co, Cr, Cu, Fe, Hf, Mg, Nb, Ni, Pd, Pt, Sr, Ta, Ti, V and Zr, if the facts that the hardness is lower than that of intermediate layer, the resistivity is not more than 50 μm Ω cm, and the melting point is not less than 600° C. are taken as criteria. Moreover, for the substrate, Cu, Cu alloy, Fe alloy, Ni alloy are used, and the intermediate layer and the surface layer are formed by physical vaporization or chemical vaporization and by physical vaporization, chemical vaporization or electrolytic plating, respectively.

And, in the fourth of said inventive materials, if the intermediate covering layer of contact has at least one selected from carbides, nitrides, borides, silicides and aluminides of transition metals of groups IVa, Va and VIa, for example, Ti, Zr, Hf, V, Nb, Ta, Cr, Mo and W as a major ingredient, it exhibits good characteristics of excellent environmental resistance, high hardness and melting point, less transfer exhaustion and low wear. Further, if layering different materials in two or more layers, the decrease in the in-film pinholes in covering layer of contact and the compensation of characteristics become possible. This contact material exhibits good characteristics of excellent environmental resistance, high hardness and melting point, less transfer exhaustion and low wear.

In this case, the covering layer of contact being the intermediate layer is formed by chemical vaporization or physical vaporization and the thickness of thin film is made to be 0.03 to 100 μm. If the thickness of film is under 0.03 μm, good electroconductivity cannot be obtained to increase the contacting resistance, the wear resistance is insufficient to give no enough life of contact, and the oxidation resistance etc. become insufficient. Also, if the thickness of film is over 100 μm, the contacting resistance increases to raise the temperature because of the roughening of surface due to coarsened crystals and the stabilized thermal conductivity cannot be obtained as well because of the thickening of film. Besides, for the substrate of the inventive contact materials, Cu, Cu alloy, Fe alloy, Ni alloy, etc. are used.

Moreover, in said electric contact materials, there are transition metals, for example, Ti, Zr and Hf for group IVa, for example, V, Nb and Ta for group Va and, for example, Cr, Mo and W for group VIa.

Next, with respect to the production methods of said inventive electric contact materials, it was made possible to make the characteristics of film, that is, hardness, specific resistance, color tone and composition ratio appropriate by forming the covering layer as said electric contact by plasma CVD method, sputtering method, ion assist vaporization method, ion plating method, laser beam sputtering method or the like.

And, by the prior arts, the covering layer of contact could not be coated directly onto the substrate, but required to be coasted intervening the covering layers of Au, Ag, Cu, etc. By the inventive production methods, however, direct coating of thin film of nitrides having at least one of transition metals of groups IVa, Va and VIa as a major ingredient onto the substrate has been made possible by performing the surface cleanings such as ion bombard, electron shower, etc. after the precise polishings such as electrolytic polishing etc. for smoothing the surface of substrate.

With respect to the forming method of thin film of nitrides in the first of the inventive production methods, as a result of diligent investigations on plasma CVD, following conditions were known to be indispensable in order to achieve the characteristics of film, that is, hardness, specific resistance, color tone, composition ratio of nitrogen to transition metal of group IVa, Va or VIa, etc.

Namely, the total pressure in the reactor on forming thin film is appropriate to be 0.1 to 10 Torr, and, using hydrogen gas as a carrier gas, the thin film of nitrides may be formed while heating the substrate to 300° to 900° C. under an atmosphere using nitrogen gas and chloride gas having at least one of transition metals of groups IVa, Va and VIa as a major-ingredient for raw material gases at a flow ratio of not higher than 7. At this time, for generating plasma, either high-frequency discharge or direct current discharge is used.

Moreover, in the second of the inventive production methods, following conditions are required in order to achieve the characteristics of film, that is, hardness of film, specific resistance, color tone, desired composition ratio of nitrogen to at least one of transition metals of groups IVa, Va and VIa, etc. on forming thin film of said nitrides by sputtering. Namely, making the total pressure in reactor on forming thin film to be 1 to 50 m Torr, the thin film of nitrides may be formed while heating the substrate plate to 300° to 900° C. under an atmosphere being the flow ratio of gases at a ratio of $N_2/(Ar+N_2) \geq 0.1$. At this time, DC or RF is used for sputtering.

Further, as the film-forming method on forming the surface layer having at least one of nitrides of transition metals of groups IVa, Va and VIa as a major ingredient on the substrate by ion assist vaporization in the third of the inventive production methods, such an equipment that, as shown in FIG. 1, an unwinding mechanism (3) and a winding mechanism (4) of substrate (2) are provided in chamber (1), an ion gun (5) irradiating nitrogen ion onto the substrate (2) and an evaporation source (6) of transition metal are installed on one side, and a heating device (7) of substrate is attached to the other side may be used. Besides, for the exhaust inside the chamber (1), both rotary pump (8) and cryopump (9) are installed and further two auxiliary exhaust systems (10) are connected. Moreover, said equipment is optional in performing continuous coating or fixing for every batch depending on the shape of substrate, but, in the case of continuous coating, said unwinding mechanism and winding mechanism may be utilized.

The thin film of nitrides may be formed by ion assist vaporization method using said equipment. At this time, the evaporation rate of transition metal of group IVa, Va or VIa is appropriate to be 0.5 Å/s to 1000 Å/s and, making the total pressure to be $10^{-3}$ to $10^{-6}$ Torr and the ratio of number of N atoms (N) to number of atoms of transition metal (T) reaching the unit area of substrate per unit time to be $2 < N/T$ under an atmosphere being the bases supplying to ion gun at a ratio of $N_2/(Ar+N_2) \geq 0.1$ and further heating the substrate to 300° to 900° C., coating is made, thereby good characteristics can be achieved.

Moreover, as the heating method of evaporation source, heating by electron beam is common, but the film formation is possible similarly by ion beam sputtering and laser ablation with inert gas ions such as Ar etc.

Moreover, as the film-forming method on forming the surface layer having at least one of nitrides of transition metals of groups IVa, Va and VIa as a major ingredient on the substrate by ion plating in the fourth of the inventive methods, such an equipment that, as shown in FIG. 2, an unwinding mechanism (3) and a winding mechanism (4) of substrate (2) are provided in chamber (1), an evaporation source (6) and an ionizing mechanism (11) ionizing nitrogen are installed on one side, and a heating device (7) of substrate is attached to the other side may be used. Besides, for the exhaust inside the chamber (1), both rotary pump (8) and cryopump (9) are installed and further two auxiliary exhaust systems (10) are connected. Moreover, said equipment is optional in performing continuous coating or fixing for every batch depending on the shape of substrate, but, in the case of continuous coating, said unwinding mechanism and winding mechanism may be utilized.

The thin film of nitrides may be formed by ion plating method using said equipment. At this time, the evaporation rate of transition metal of group IVa, Va or VIa is appropriate to be 0.5 Å/s to 1000 Å/s and, making the total pressure to be $10^{-2}$ to $10^{-5}$ Torr and the ratio of number of N atoms (N) to number of atoms of transition metal (T) reaching the unit area of substrate per unit time to be $2 < N/T$ under an atmosphere being the gases supplying to ionizing mechanism at a ratio of $N_2/(Ar+N_2) \geq 0.1$ and further heating the substrate to 300° to 900° C., coating is made, thereby good characteristics can be achieved.

Moreover, as the heating method of evaporation source, heating by electron beam is common, but the film formation is possible similarly by ion beam sputtering and laser ablation with inert gas ions such as Ar etc.

Further, in the forming method of thin film of nitrides in the fifth of the inventive production methods, as a result of diligent investigations on the laser beam sputtering method, following conditions are known to be indispensable in order to achieve the characteristics of film, that is, hardness, specific resistance, color tone, given composition ratio of nitrogen to transition metal of group IVa, Va or VIa, etc.

Namely, in the reactor on forming thin film, making the flow ratio of nitrogen gas to argon gas as an atmosphere to be $N_2/(Ar+N_2) \geq 0.1$, the thin film of nitrides is formed while heating the substrate to 300° to 900° C.

And, by using short-wavelength laser beam irradiation, ultraviolet ray irradiation or RF plasma-excitation, good effects are further exerted on the lowering of substrate temperature and the crystal characteristics of thin film.

Next, as the first of the inventive electric contacts, the electric contact having good characteristics can be obtained by decreasing the thickness of film of nitrides, carbides, silicides, diborides and aluminides of trnasition metals of groups IVa, Va and VIa, for example, Ti, Zr, Hf, V, Nb, Ta, Cr, Mo and W to be 300 Å to 100 μm. However, for improving the life characteristics further, the problem of adherence cannot be neglected. There, in the second of the inventive electric contacts, one contacting portion A is formed with at least one of nitrides, carbides, silicides, diborides and aluminides of transition metals of IVa, Va and VIa making it as a major ingredient and the contacting portion B opposing thereto is formed with different material quality from said contacting portion A, for example, with at least one of nitrides, carbides, silicides, diborides and aluminides of transition metals of groups IVa, Va and VIa different from nitrides, carbides, silicides, diborides and aluminides of transition metals of groups IVa, Va and VIa forming the contacting portion A making it as a major ingredient, or the film of contact is formed with platinum group metal or alloy, thus obtaining hardly adherent electric contact.

Besides, for the substrate, Cu, Cu alloy, Fe alloy, Ni alloy, etc. such as 52% Ni-Fe alloy (52 Alloy), phosphor bronze, etc. are used. For forming nitrides, carbides, silicides, diborides and aluminides of transition metals of groups IVa, Va and VIa on the substrate, vaporization, ion assist vaporization from gas ion source, ion assist vaporization from solid ion source, sputtering, laser beam sputtering, CVD, etc. are used and, for forming platinum group metal or alloy, said physical vaporization, chemical vaporization or electrolytic plating is used. Moreover, for the pretreatment of substrate before vaporization or electrolytic plating, electrolytic polishing and ion bombard treatments are carried out after the organic cleaning, thereby the thermal shock resistance is enhanced.

BEST EMBODIMENT FOR PRACTICING THE INVENTION

Figure 1:
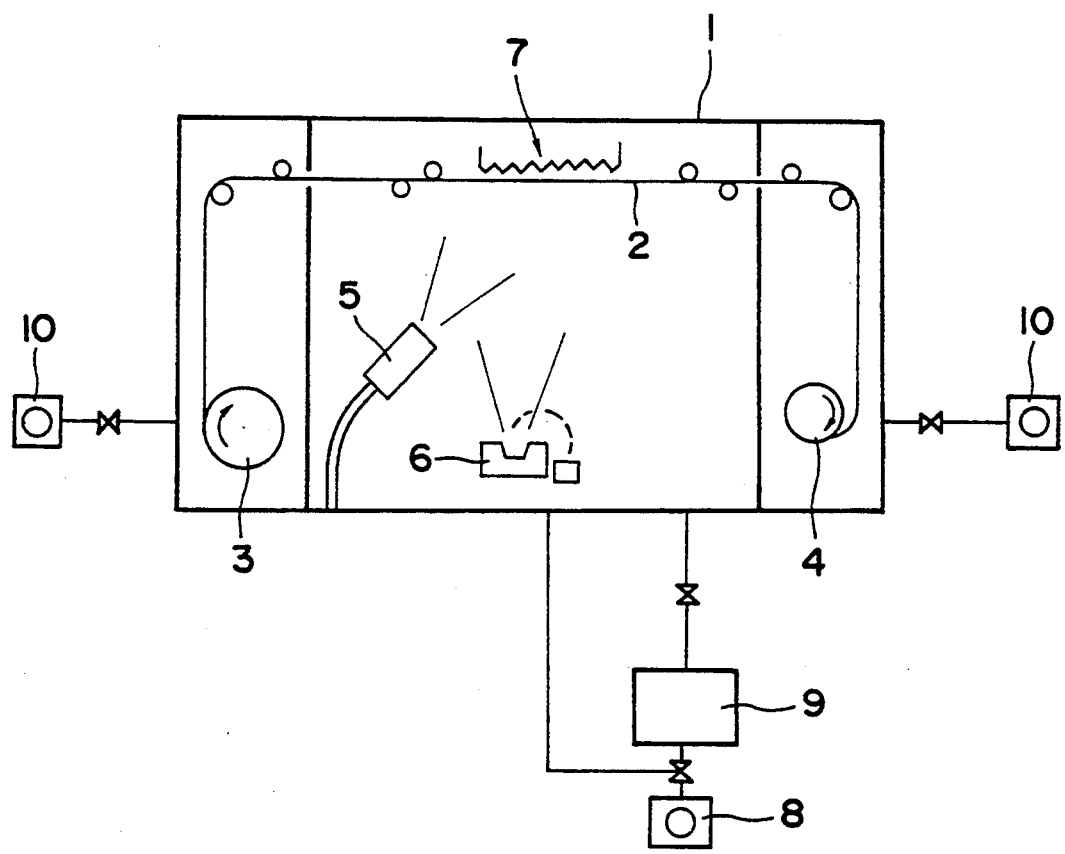
FIG. 1 is an illustration diagram showing one example of the constitution of equipment to practice the inventive method by ion assist vaporization.

In following, examples of the invention will be described.

EXAMPLE 1

Inventive example 1

Using 52 Alloy (52% Ni-Fe alloy) as a substrate, organic cleaning and electrolytic polishing were performed, and then, following the surface cleaning of one side thereof by ion bombard with Ar in vacuum equipment, a film of ZrN was formed by ion assist vaporization in a thickness of 1 μm to produce the first of said inventive electric contact materials.

Inventive example 2

Similarly to the inventive example 1, a film of ZrN was formed in a thickness of 10 μm to produce the first of the inventive electric contact materials.

Inventive example 3

Similarly to the inventive example 1, a film of ZrN was formed in a thickness of 80 μm to produce the first of the inventive electric contact materials.

Comparative example 1

Similarly to the inventive example 1, a film of ZrN was formed in a thickness of 200 Å to produce comparative electric contact material.

Comparative example 2

Similarly to the inventive example 1, a film of ZrN was formed in a thickness of 130 μm to produce comparative electric contact material.

Inventive example 4

Using 52 Alloy as a substrate, organic cleaning and electrolytic polishing were performed and then a film of ZrN was formed on one side thereof by ion assist vaporization in a thickness of 1 μm to produce the first of the preventive electric contact materials.

Inventive example 5

Using 52 Alloy as a substrate, organic cleaning and electrolytic polishing were performed, and then, following the surface cleaning of one side thereof by ion bombard with Ar in vacuum equipment, a film of $ZrB_2$ was formed by chemical vaporization in a thickness of 5 μm to produce the first of the inventive electric contact materials.

Inventive example 6

Using 52 Alloy as a substrate, surface cleaning was performed similarly to the inventive example 5 and then a film of $TiB_2$ was formed by sputtering in a thickness of 3 μm to produce the first of the inventive electric contact materials.

Inventive example 7

Using 52 Alloy as a substrate, surface cleaning was performed similarly to the inventive example 5 and then a film of TaC was formed by reactive vaporization in a thickness of 1 μm to produce the first of the inventive electric contact materials.

Inventive example 8

After formed the film of ZrN by chemical vaporization in a thickness of 0.5 μm similarly to the inventive example 5, a film of $TiB_2$ was formed by sputtering in a thickness of 0.5 μm to produce the first of the inventive electric contact materials.

Inventive example 9

After formed the film of $TiB_2$ by sputtering in a thickness of 2 μm similarly to the inventive example 5, a film of $ZrB_2$ was formed by chemical vaporization in a thickness of 3 μm to produce the first of the inventive electric contact materials.

Conventional example 1

Using 52 Alloy as a substrate, organic cleaning and electrolytic polishing were performed and then Ag-30% Pd alloy was formed on one side thereof by chemical plating in a thickness of 300 μm to produce conventional electric contact material.

Conventional example 2

After formed a film of Au by chemical plating in a thickness of 1 μm similarly to conventional example 1, a film of Rh was formed by chemical plating in a thickness of 2 μm to produce conventional electric contact material.

Figure 3:
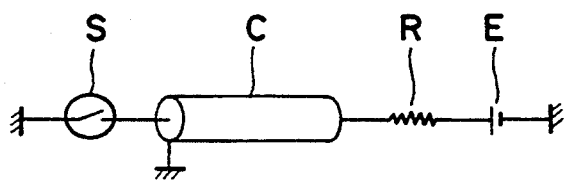
FIG. 3 is an illustration diagram of circuit used for testing the durability of electric contact.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 1.

For the contacting resistance, temperature rise and number of works at which cumulative failure rate becomes over 50%, 100 mA current was turned on through the circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ◯ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ◯ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ◯ and mark Δ, respectively.

TABLE 1

| Example | Contacting resistance (mΩ) | Temperature rise (°C.) | Number of works at which cumulative failure rate becomes over 50% | Heat cycle test | Oxidation resistance | Corrosion resistance to organic gas | Cost |
|---|---|---|---|---|---|---|---|
| Inventive example 1 | 11–14 | 42 | $1 \times 10^7$ | ◯ | ◯ | ◯ | Low |
| Inventive example 2 | 10–13 | 43 | $1 \times 10^7$ | ◯ | ◯ | ◯ | " |
| Inventive example 3 | 10–14 | 42 | $1 \times 10^7$ | ◯ | ◯ | ◯ | " |
| Comparative example 1 | 60 | 120 | $1 \times 10^5$ | ◯ | ◯ | △ | " |
| Comparative example 2 | 50 | 200 | $1 \times 10^6$ | ◯ | ◯ | ◯ | " |
| Inventive example 4 | 13–17 | 50 | $1 \times 10^6$ | △ | ◯ | ◯ | " |
| Inventive example 5 | 11–13 | 40 | $2 \times 10^7$ | ◯ | ◯ | ◯ | " |
| Inventive example 6 | 10–13 | 38 | $2 \times 10^7$ | ◯ | ◯ | ◯ | " |
| Inventive example 7 | 10–14 | 42 | $8 \times 10^6$ | ◯ | ◯ | ◯ | " |
| Inventive example 8 | 11–13 | 40 | $1 \times 10^7$ | ◯ | ◯ | ◯ | " |
| Inventive example 9 | 10–13 | 45 | $2 \times 10^7$ | ◯ | ◯ | ◯ | " |
| Conventional example 1 | 8–12 | 40 | $1 \times 10^5$ | △ | △ | △ | High |
| Conventional example 2 | 5–8 | 37 | $1 \times 10^6$ | ◯ | △ | △ | High |

As evident from Table 1, it can be seen that the first of the inventive materials shown in the inventive examples 1 through 9 has approximately equal contacting resistance to the materials shown in conventional examples 1 and 2 and is more excellent in the adhesion, environmental resistance and cost over them leading to the improved life as a contact.

Whereas, with the materials shown in comparative examples 1 and 2 being out of the covering rate prescribed by the invention, it is seen that the contacting resistance is high and the temperature rise is remarkable showing unpreferability as a contact.

EXAMPLE 2

Inventive Example 10

Using 42 Alloy plate as a substrate, a film of $ZrB_2$ was formed on one side thereof by vacuum vaporization at a film-forming temperature of 500° C. in a thickness of 5 μm to produce the first of the inventive electric contact materials.

Inventive Example 11

Using 42 Alloy plate as a substrate, a film of $TiB_2$ was formed on one side thereof by sputtering at a film-forming temperature of 400° C. in a thickness of 3 μm to produce the first of the inventive electric contact materials.

Inventive Example 12

Using 42 Alloy plate as a substrate, a film of TaC was formed on one side thereof by chemical vaporaization at a film-forming temperature of 600° C. in a thickness of 1 μm to produce the first of the inventive electric contact materials.

Inventive Example 13

Using 42 Alloy plate as a substrate, a film of ZrN was formed on one side thereof by chemical vaporization at a film-forming temperature of 500° C. in a thickness of 2 μm to produce the first of the inventive electric contact materials.

Inventive Example 14

Using 42 Alloy plate as a substrate, a film of $ZrB_2$ and $TiB_2$ at a ratio of 9:1 was formed on one side thereof by simultaneous ternary vaporization at a film-forming temperature of 500° C. in a thickness of 3 μm to produce the first of the inventive electric contact materials.

Inventive Example 15

Using 42 Alloy plate as a substrate, a film of $TiB_2$ and ZrN at a ratio of 8:2 was formed on one side thereof by simultaneous sputtering at a film-forming temperature of 400° C. in a thickness of 3 μm using $TiB_2$ target and ZrN target to produce the first of the inventive electric contact materials.

Conventional Example 3

Using 42 Alloy as a substrate, a film of Ag was formed on one side thereof by chemical plating in a thickness of 300 μm to produce conventional electric contact material.

Conventional Example 4

Using 42 Alloy as a substrate, a film of Ag-30% Pd alloy was formed on one side thereof by chemical plating in a thickness of 300 μm to produce conventional electric contact material.

Electric contact cut off from said each electric contact material was integrated into switch, and the oxidation resistance and sulfurization resistance were examined together with the determination of number of times of melting adherence and contacting resistance. Results are shown in Table 2.

For the number of times of melting adherence and the contacting resistance, a test to turn on and off said switch 5000 times was performed under conditions of 100 V alternating current, 10 A loading current and contacting force of 50 g. For the oxidation resistance and sulfurization resistance, the oxidation resistance was examined by allowing said electric contact material to stand for 50 hours in a high-temperature atmosphere of 400° C. and the sulfurization resistance was examined by allowing electric contact material to stand for 1000 hours in an atmosphere of 100 ppm of hydrogen sulfide.

TABLE 2

| | Electric contact | Thickness (μm) | Number of times of melting adherence | Contacting resistance (mΩ) | Oxidation resistance | Sulfurization resistance |
|---|---|---|---|---|---|---|
| Inventive example 10 | $ZrB_2$ | 5 | 0 | 11–13 | ◯ | ◯ |
| Inventive | $TiB_2$ | 3 | 0 | 10–13 | ◯ | ◯ |

TABLE 2-continued

| Electric contact | | Thickness (μm) | Number of times of melting adherence | Contacting resistance (mΩ) | Oxidation resistance | Sulfurization resistance |
| --- | --- | --- | --- | --- | --- | --- |
| example 11 | | | | | | |
| Inventive example 12 | TaC | 1 | 0 | 10–14 | ◯ | ◯ |
| Inventive example 13 | ZrN | 2 | 0 | 12–15 | ◯ | ◯ |
| Inventive example 14 | ZrB$_2$, TiB$_2$ | 3 | 0 | 11–13 | ◯ | ◯ |
| Inventive example 15 | TiB$_2$, ZrN | 3 | 0 | 12–14 | ◯ | ◯ |
| Conventional example 3 | Ag | 300 | 10 | 2–5 | ◯ | X |
| Conventional example 4 | Ag-30% Pd | 300 | 5 | 8–12 | ◯ | Δ |

(Note)
mark ◯ = good, mark Δ = slightly poor, mark X = poor

As evident from Table 2, it can be seen that the first of the inventive materials shown in the inventive examples 10 through 15 has approximately equal contacting resistance and oxidation resistance to the materials shown in conventional examples 3 and 4 and has less number of times of melting adherence and more excellent sulfurization resistance over them.

EXAMPLE 3

Inventive example 16

As a substrate, 52 Alloy was used. After the organic cleaning and electrolytic polishing, surface cleaning was performed on one side thereof by ion bombard with Ar in vacuum equipment. Next, Zr was coated first by ion assist vaporization and, by gradually increasing nitrogen, an intermediate layer with gradient composition finally becoming ZrN was formed in a thickness of 0.5 μm. Successively, a film of ZrN was formed in a thickness of 1 μm to produce the second of said inventive electric contact materials.

Inventive example 17

Similarly to the inventive example 16, an intermediate layer with gradient composition was formed in a thickness of 5 μm and successively a film of ZrN was formed in a thickness of 1 μm to produce the second of the inventive electric contact materials.

Inventive example 18

Similarly to the inventive example 16, an intermediate layer with gradient composition was formed in a thickness of 50 μm and successively a film of ZrN was formed in a thickness of 1 μm to produce the second of the inventive electric contact materials.

Inventive example 19

Similarly to the inventive example 16, an intermediate layer with gradient composition was formed in a thickness of 5 μm and successively a film of ZrN was formed in a thickness of 10 μm to produce the second of the inventive electric contact materials.

Inventive example 20

Similarly to the inventive example 16, an intermediate layer with gradient composition was formed in a thickness of 5 μm and successively a film of ZrN was formed in a thickness of 80 μm to produce the second of the inventive electric contact materials.

Comparative example 3

Similarly to the inventive example 16, an intermediate layer with gradient composition was formed in a thickness of 0.05 μm and successively a film of ZrN was formed in a thickness of 1 μm to produce comparative electric contact material.

Comparative example 4

Similarly to the inventive example 16, an intermediate layer with gradient composition was formed in a thickness of 5 μm and successively a film of ZrN was formed in a thickness of 0.02 μm to produce comparative electric contact material.

Comparative example 5

Similarly to the inventive example 16, an intermediate layer with gradient composition was formed in a thickness of 5 μm and successively a film of ZrN was formed in a thickness of 130 μm to produce comparative electric contact material.

Inventive example 21

As a substrate, 52 Alloy was used. After the organic cleaning and electrolytic polishing, surface cleaning was performed on one side thereof by ion bombard with Ar in vacuum equipment. Next, Zr was coated first by reactive vaporization and, by gradually increasing boron, an intermediate layer with gradient composition finally becoming ZrB$_2$ was formed in a thickness of 1 μm. Successively, a film of ZrB$_2$ was formed in a thickness of 3 μm to produce the second of the inventive electric contact materials.

Inventive example 22

Similarly to the inventive example 21, the surface cleaning was performed. Next, Ti was coated first by chemical vaporization and, by gradually increasing boron, an intermediate layer with gradient composition finally becoming TiB$_2$ was formed in a thickness of 2 μm. Successively, a film of TiB$_2$ was formed in a thickness of 1 μm to produce the second of the inventive electric contact materials.

Inventive example 23

Similarly to the inventive example 21, the surface cleaning was performed. Next, Ta was coated first by sputtering and, by gradually increasing carbon, an intermediate layer with gradient composition finally becoming TaC was formed in a thickness of 3 μm. Successively, a film of TaC was formed in a thickness of 0.5 μm to produce the second of the inventive electric contact materials.

Inventive example 24

Similarly to the inventive example 21, the surface cleaning was performed. Next, Zr was coated first by ion assist vaporization and, by gradually increasing nitrogen, an intermediate layer with gradient composition finally becoming ZrN was formed in a thickness of 2 μm. Successively, a film of ZrN was formed in a thickness of 0.5 μm and, thereon, a film of TiB$_2$ was formed in a thickness of 0.5 μm to produce the second of the inventive electric contact materials.

Inventive example 25

Similarly to the inventive example 21, the surface cleaning was performed. Next, Zr was coated first by chemical vaporization and, by gradually increasing boron, an intermediate layer with gradient composition finally becoming ZrB$_2$ was formed in a thickness of 3 μm. Successively, a film of ZrB$_2$ was formed in a thickness of 1 μm and, thereon further, a film of TaC was formed in a thickness of 0.5 μm to produce the second of the inventive electric contact materials.

Inventive example 26

As a substrate, 52 Alloy was used. After the organic cleaning and electrolytic polishing, surface cleaning was performed on one side thereof by ion bombard with Ar in vacuum equipment. Next, a film of ZrN was formed by ion assist vaporization in a thickness of 1 μm to produce the first of said inventive electric contact materials.

Inventive example 27

Similarly to the inventive example 26, the surface cleaning was performed and, next, a film of TiB$_2$ was formed by chemical vaporization in a thickness of 2 μm to produce the first of the inventive electric contact materials.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined tegether with heat cycle test. These results are shown in Table 3.

For the contacting resistance, temperature rise and number of works of which cumulative failure rate becomes over 50%, 100 mA current was turned on through the circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one entirely without change, one without cracks and one with somewhat cracks were indicated by mark ⊙, mark ◯ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface and one little oxidized and one somewhat oxidized were indicated by mark ◯ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ◯ and mark Δ, respectively.

TABLE 3

| Example | Contacting resistance (mΩ) | Temperature rise (°C.) | Number of works at which cumulative failure rate becomes over 50% | Heat cycle test | Oxidation resistance | Corrosion resistance to organic gas | Cost |
| --- | --- | --- | --- | --- | --- | --- | --- |
| Inventive example 16 | 11–14 | 42 | $1 \times 10^7$ | ⊙ | ◯ | ◯ | Low |
| Inventive example 17 | 8–10 | 40 | $7 \times 10^7$ | ⊙ | ◯ | ◯ | " |
| Inventive example 18 | 7–9 | 39 | $7 \times 10^7$ | ⊙ | ◯ | ◯ | " |
| Inventive example 19 | 8–10 | 40 | $8 \times 10^6$ | ⊙ | ◯ | ◯ | " |
| Inventive example 20 | 7–9 | 39 | $8 \times 10^7$ | ⊙ | ◯ | ◯ | " |
| Comparative example 3 | 30 | 100 | $1 \times 10^6$ | Δ | ◯ | ◯ | " |
| Comparative example 4 | 50 | 100 | $6 \times 10^5$ | ⊙ | Δ | ◯ | " |
| Comparative example 5 | 40 | 110 | $6 \times 10^6$ | ⊙ | ◯ | ◯ | " |
| Inventive example 21 | 7–9 | 38 | $8 \times 10^7$ | ⊙ | ◯ | ◯ | " |
| Inventive example 22 | 8–10 | 40 | $8 \times 10^7$ | ⊙ | ◯ | ◯ | " |
| Inventive example 23 | 8–11 | 41 | $8 \times 10^7$ | ⊙ | ◯ | ◯ | " |
| Inventive example 24 | 8–10 | 39 | $8 \times 10^7$ | ⊙ | ◯ | ◯ | " |
| Inventive example 25 | 8–10 | 40 | $8 \times 10^7$ | ⊙ | ◯ | ◯ | " |
| Inventive example 26 | 11–14 | 43 | $1 \times 10^7$ | ◯ | ◯ | ◯ | " |
| Inventive example 27 | 10–13 | 42 | $2 \times 10^7$ | ◯ | ◯ | ◯ | " |

As evident from Table 3, it can be seen that each of the second of the inventive materials provided with the intermediate layer with gradient composition between substrate and covering layer of electric contact is excellent in the contacting resistance and adhesion compared with the first of the inventive materials without said intermediate layer shown in the inventive examples 26 and 27 leading to the improved life as a contact.

Whereas, with comparative examples being out of the covering rates of intermediate layer and outermost layer prescribed by the invention, it is seen that the contacting resistance and temperature rise are remarkable showing unpreferability as a contact.

EXAMPLE 4

Inventive example 28

After the organic cleaning and electrolytic polishing using 52 Alloy as a substrate, the surface cleaning was performed on one side thereof by ion bombard with Ar in vacuum equipment. Next, a film of Ag was formed by ion assist vaporization in a thickness of 1 μm and successively a film of ZrN was formed in a thickness of 1 μm to produce the third of the inventive electric contact materials.

Inventive example 29

Similarly to the inventive example 28, the intermediate layer of Ag was formed in a thickness of 10 μm and successively a film of ZrN was formed in a thickness of 1 μm to produce the third of the inventive electric contact materials.

Inventive example 30

Similarly to the inventive example 28, the intermediate layer of Ag was formed in a thickness of 50 μm and successively a film of ZrN was formed in a thickness of 1 μm to produce the third of the inventive electric contact materials.

Inventive example 31

Similarly to the inventive example 28, the intermediate layer of Ag was formed in a thickness of 1 μm and successively a film of ZrN was formed in a thickness of 10 μm to produce the third of the inventive electric contact materials.

Inventive example 32

Similarly to the inventive example 28, the intermediate layer of Ag was formed in a thickness of 1 μm and successively a film of ZrN was formed in a thickness of 80 μm to produce the third of the inventive electric contact materials.

Comparative example 6

Similarly to the inventive example 28, the intermediate layer of Ag was formed in a thickness of 0.005 μm and successively a film of ZrN was formed in a thickness of 1 μm to produce comparative electric contact material.

Comparative example 7

Similarly to the inventive example 28, the intermediate layer of Ag was formed in a thickness of 1 μm and successively a film of ZrN was formed in a thickness of 0.02 μm to produce comparative electric contact material.

Comparative example 8

Similarly to the inventive example 28, the intermediate layer of Ag was formed in a thickness of 1 μm and successively a film of ZrN was formed in a thickness of 130 μm to produce comparative electric contact material.

Inventive example 33

After the organic cleaning and electrolytic polishing using 52 Alloy as a substrate, the surface cleaning was performed on one side thereof by ion bombard with Ar in vacuum equipment. Next, a film of Au was formed by vacuum vaporization in a thickness of 1 μm as an intermediate layer and successively a film of ZrN was formed by reactive vaporization in a thickness of 1 μm to produce the third of the inventive electric contact materials.

Inventive example 34

Surface cleaning was performed similarly to the inventive example 33 and a film of Ag was formed by sputtering in a thickness of 1 μm. Next, a film of Cu was formed in a thickness of 1 μm as an intermediate layer. Successively, after formed a film of ZrN by reactive sputtering in a thickness of 1 μm, this was treated under heat for 1 hour at 600° C. in an atmosphere of nitrogen to produce the third of the inventive electric contact materials.

Inventive example 35

Surface cleaning was performed similarly to the inventive example 33 and a film of Ni was formed by sputtering in a thickness of 1 μm as an intermediate layer. Successively, after formed a film of ZrN by chemical vaporization in a thickness of 1 μm, a film of $TiB_2$ was formed in a thickness of 1 μm to produce the third of the inventive electric contact materials.

Inventive example 36

Surface cleaning was performed similarly to the inventive example 33 and a film of Cu was formed by vacuum vaporization in a thickness of 0.5 μm. Next, a film of Ni was formed in a thickness of 1 μm as an intermediate layer. Successively, after formed a film of $TiB_2$ by sputtering in a thickness of 1 μm, a film of TaC was formed in a thickness of 0.5 μm to produce the third of the inventive electric contact materials.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 4.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of workd at which cumulative failure rate becomes over 50% due to melting, adherence, etc.

For the heat cycle test, heating of contact from room temperature to 400° C. was repeated 100 cycles to observe the externally appearing cracks in thin film of contact, and one entirely without change, one without cracks and one with somewhat cracks were indicated by mark ⊙, mark ◯ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ◯ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ◯ and mark Δ, respectively.

TABLE 4

| Example | Contacting resistance (mΩ) | Temperature rise (°C.) | Number of works at which cumulative failure rate becomes over 50% | Heat cycle test | Oxidation resistance | Corrosion resistance to organic gas | Cost |
| --- | --- | --- | --- | --- | --- | --- | --- |
| Inventive example 28 | 8–10 | 40 | $6 \times 10^7$ | ⊙ | ◯ | ◯ | Low |
| Inventive example 29 | 7–10 | 39 | $6 \times 10^7$ | ⊙ | ◯ | ◯ | " |
| Inventive example 30 | 8–10 | 40 | $6 \times 10^7$ | ⊙ | ◯ | ◯ | " |
| Inventive example 31 | 8–10 | 40 | $7 \times 10^6$ | ⊙ | ◯ | ◯ | " |
| Inventive example 32 | 7–10 | 38 | $7 \times 10^7$ | ⊙ | ◯ | ◯ | " |
| Comparative | 30 | 100 | $1 \times 10^6$ | Δ | ◯ | ◯ | " |

TABLE 4-continued

| Example | Contacting resistance (mΩ) | Temperature rise (°C.) | Number of works at which cumulative failure rate becomes over 50% | Heat cycle test | Oxidation resistance | Corrosion resistance to organic gas | Cost |
| --- | --- | --- | --- | --- | --- | --- | --- |
| example 6 | | | | | | | |
| Comparative example 7 | 50 | 100 | $5 \times 10^5$ | ⊚ | △ | △ | " |
| Comparative example 8 | 45 | 120 | $5 \times 10^6$ | ⊚ | ○ | ○ | " |
| Inventive example 33 | 8–10 | 40 | $7 \times 10^7$ | ⊚ | ○ | ○ | " |
| Inventive example 34 | 7–10 | 39 | $8 \times 10^7$ | ⊚ | ○ | ○ | " |
| Inventive example 35 | 8–10 | 40 | $7 \times 10^7$ | ⊚ | ○ | ○ | " |
| Inventive example 36 | 8–11 | 40 | $7 \times 10^7$ | ⊚ | ○ | ○ | " |
| Inventive example 26 | 11–14 | 43 | $1 \times 10^7$ | ○ | ○ | ○ | " |
| Inventive example 27 | 10–13 | 42 | $2 \times 10^7$ | ○ | ○ | ○ | " |

As evident from Table 4, it can be seen that the third of the inventive materials provided with the intermediate layer comprising soft metal between substrate and covering layer of electric contact is excellent in the contacting resistance and adhesion compared with the first of the inventive materials without said intermediate layer shown in the inventive examples 26 and 27 leading to the improved life of contact.

Whereas, with comparative examples being out of the covering rate prescribed by the invention, it is seen that the contacting resistance and temperature rise are remarkable showing unpreferability as a contact.

EXAMPLE 5

Inventive example 37

Using 42 Alloy as a substrate, Zr being the intermediate layer was first formed on one side thereof by vacuum vaporization in a thickness of 3 μm and successively a film of $ZrB_2$ was formed in a thickness of 0.4 μm to produce the third of said inventive electric contact materials.

Inventive example 38

Using 42 Alloy as a substrate, Zr being the intermediate layer was first formed on one side thereof by vacuum vaporization in a thickness of 3 μm and successively, introducing nitrogen gas, a film of ZrN was formed by reactive vaporization at a temperature of substrate plate of 600° C. in a thickness of 0.2 μm to produce the third of the inventive electric contact materials.

Inventive example 39

Using phosphor bronze as a substrate, Ti being the intermediate layer was first formed on one side thereof by sputtering in a thickness of 3 μm and successively a film of $TiB_2$ was formed in a thickness of 0.3 μm to produce the third of the inventive electric contact materials.

Inventive example 40

Using Permalloy as a substrate, Ta being the intermediate layer was first formed on one side thereof by chemical vaporization in a thickness of 3 μm and successively a film of TaC was formed in a thickness of 0.5 μm to produce the third of the inventive electric contact materials.

Inventive example 41

Using 42 Alloy as a substrate, a film of $ZrB_2$ was formed on one side thereof by vacuum vaporization in a thickness of 1 μm to produce the first of said inventive electric contact materials.

Inventive example 42

Using 42 Alloy as a substrate, a film of $ZrB_2$ was formed on one side thereof by vacuum vaporization in a thickness of 0.4 μm to produce the first of said inventive electric contact materials.

The electric contact was cut off from said each contact material thus produced and integrated into a switch to examine the heat cycle test, oxidation resistance, sulfurization resistance and temperature rise. The results are shown in Table 5.

For the heat cycle test, heating of contact from room temperature to 400° C. was repeated 100 cycles to observe the externally appearing cracks in thin film of contact. As for the oxidation resistance, the contact was allowed to stand for 500 hours in an atmosphere of 400° C. to observe the extent of oxidation from the situation of surface. As for the sulfurization resistance, the contact was allowed to stand for 1000 hours in an atmosphere of 90% relative humidity and 10 ppm of hydrogen sulfide to observe the situation of surface. Moreover, the temperature rise of electric contact was examined by performing ON-OFF test under the conditions of 100 V AC, 10 A load current and contacting pressure of 50 g.

TABLE 5

| | Heat cycle test | Oxidation resistance, Sulfurization resistance | Temperature rise (°C.) |
| --- | --- | --- | --- |
| Inventive example 37 | ○ | ○ | 42 |
| Inventive example 38 | ○ | ○ | 42 |
| Inventive example 39 | ○ | ○ | 43 |
| Inventive example 40 | ○ | ○ | 45 |
| Inventive example 41 | △ | ○ | 41 |
| Inventive example 42 | △ | △ | 40 |

(In the table, mark ○ indicates good and mark △ slightly poor.)

As evident from Table 5, with the third of the inventive materials shown in the inventive examples 37 through 40, wherein the intermediate layer comprising soft metal is provided between substrate and covering layer of electric contact and the same transition metal as that constituting carbides, nitrides, borides, etc. to be formed thereon is used as said intermediate layer, the oxidation resistance and the sulfurization resistance are good, the temperature rise is slight and there is no damage of thin film due to the difference in thermal expansion in the heat cycle test. Thus it can be seen that the third is superior to the first of the inventive materials shown in the inventive examples 41 and 42, wherein said intermediate layer is not provided.

EXAMPLE 6

Inventive example 43

Using 52 Alloy as a substrate, the organic cleaning, electrolytic polishing and ion bombard were performed as the pretreatments, ZrN was formed at a film-forming temperature of 500° C. by vaporization in a thickness of 1 μm as an intermediate layer and, thereon, Au was formed by sputtering in a thickness of 0.1 μm as a surface layer to produce the fourth of said inventive electric contact materials.

Inventive example 44

Similarly to the inventive example 43, ZrN was formed on the substrate of 52 Alloy in a thickness of 10 μm as an intermediate layer and Au was formed in a thickness of 0.1 μm as a surface layer to produce the fourth of the inventive electric contact materials.

Inventive example 45

Similarly to the inventive example 43, ZrN was formed on the substrate of 52 Alloy in a thickness of 80 μm as an intermediate layer and Au was formed in a thickness of 0.1 μm as a surface layer to produce the fourth of the inventive electric contact materials.

Comparative example 9

Similarly to the inventive example 43, ZrN was formed on the substrate of 52 Alloy in a thickness of 200 Å as an intermediate layer and Au was formed in a thickness of 0.1 μm as a surface layer to produce comparative electric contact material.

Comparative example 10

Similarly to the inventive example 43, ZrN was formed on the substrate of 52 Alloy in a thickness of 130 μm as an intermediate layer and Au was formed in a thickness of 0.1 μm as a surface layer to produce comparative electric contact material.

Comparative example 11

Similarly to the inventive example 43, ZrN was formed on the substrate of 52 Alloy in a thickness of 1 μm as an intermediate layer and Au was formed in a thickness of 50 Å as a surface layer to produce comparative electric contact material.

Inventive example 46

Using 52 Alloy as a substrate, the organic cleaning, electrolytic polishing and ion bombard were performed as the pretreatments, ZrN was formed at a film-forming temperature of 500° C. by vaporization in a thickness of 1 μm as an intermediate layer and, thereon, Pt was formed by sputtering in a thickness of 0.1 μm as a surface layer to produce the fourth of the inventive electric contact materials.

Inventive example 47

Similarly to the inventive example 46, substrate of 52 Alloy was pretreated, ZrN was formed in a thickness of 1 μm as an intermediate layer and Pd was formed by sputtering in a thickness of 0.1 μm as a surface layer to produce the fourth of the inventive electric contact materials.

Inventive example 48

Similarly to the inventive example 46, substrate of 52 Alloy was pretreated, ZrB$_2$ was formed at a film-forming temperature of 600° C. by vaporization in a thickness of 5 μm as an intermediate layer and Au was formed by sputtering in a thickness of 0.1 μm as a surface layer to produce the fourth of the inventive electric contact materials.

Inventive example 49

Similarly to the inventive example 46, substrate of 52 Alloy was pretreated, TiB$_2$ was formed at a film-forming temperature of 600° C. by vaporization in a thickness of 1 μm as an intermediate layer and Au was formed by sputtering in a thickness of 0.1 μm as a surface layer to produce the fourth of the inventive electric contact materials.

Inventive example 50

Similarly to the inventive example 46, substrate of 52 Alloy was pretreated, TaC was formed at a film-forming temperature of 500° C. by vaporization in a thickness of 1 μm as an intermediate layer and Au was formed by sputtering in a thickness of 0.1 μm as a surface layer to produce the fourth of the inventive electric contact materials.

Inventive example 51

Similarly to the inventive example 46, substrate of 52 Alloy was pretreated, TiB$_2$ was formed at a film-forming temperature of 600° C. by sputtering in a thickness of 0.5 μm as an intermediate layer, ZrN was formed thereon at a film-forming temperature of 500° C. by vaporization in a thickness of 0.5 μm and Au was formed by sputtering in a thickness of 0.1 μm as a surface layer to produce the fourth of the inventive electric contact materials.

Inventive example 52

Similarly to the inventive example 46, substrate of 52 Alloy was pretreated, ZrB$_2$ was formed at a film-forming temperature of 600° C. by sputtering in a thickness of 3 μm as an intermediate layer, TiB$_2$ was formed thereon at a film-forming temperature of 600° C. by sputtering in a thickness of 2 μm and Au was formed by sputtering in a thickness of 0.1 μm as a surface layer to produce the fourth of the inventive electric contact materials.

Inventive example 53

Similarly to the inventive example 46, substrate of 52 Alloy was pretreated, ZrN was formed at a film-forming temperature of 600° C. by sputtering in a thickness of 0.2 μm as an intermediate layer, TiB$_2$ was formed thereon at a film-forming temperature of 600° C. by sputtering in a thickness of 0.2 μm and Au was formed by sputtering in a thickness of 0.1 μm as a surface layer to produce the fourth of the inventive electric contact materials.

Inventive example 54

Using 52 Alloy as a substrate, the organic cleaning, electrolytic polishing and ion bombard were performed as the pretreatments and, thereon, ZrN was formed at a film-forming temperature of 500° C. by vaporization in a thickness of 1 μm as a surface layer to produce the first of said inventive electric contact materials.

Conventional example 5

Using 52 Alloy as a substrate, the organic cleaning and electrolytic polishing were performed and Ag-30% Pd alloy was formed thereon by electrolytic plating in a thickness of 300 μm as a surface layer to produce conventional electric contact material.

Conventional example 6

Using 52 Alloy as a substrate, the organic cleaning and electrolytic polishing were performed, Au was formed thereon by electrolytic plating in a thickness of 1 μm as a surface layer and, thereon, Rh was formed in a thickness of 2 μm to produce conventional electric contact material.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 6.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ◯ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ◯ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ◯ and mark Δ, respectively.

Whereas, with the comparative examples being out of the covering rate prescribed by the invention, it is seen that the contacting resistance or the temperature rise is high or the life of contact is poor leading to the unsuitability as a contact.

EXAMPLE 7

Inventive example 55

After performed the organic cleaning and electrolytic polishing using 52 Alloy as a substrate, the surface was cleaned by applying ion bombard onto one side thereof with Ar in vacuum. Next, by using plasma CVD, making an atmosphere wherein 30 ml/s of hydrogen gas is flown as a carrier gas and, in addition to this, 1.5 ml/s of nitrogen gas and 0.4 ml/s of titanium tetrachloride gas are flown as raw material gases, stabilizing the total pressure in the reactor to be 0.4 Torr, heating the substrate to a temperature of 500° C. and generating plasma by the use of 13.56 MHz high-frequency at an output of 1.5 KW, film of TiN was formed in a thickness of 1 μm to produce electric contact material according to the first of said inventive production methods.

Inventive example 56

Similarly to the inventive example 55, a film of TiN was formed in a thickness of 10 μm to produce electric contact material according to the first of the inventive production methods.

Inventive example 57

Similarly to the inventive example 55, a film of TiN was formed in a thickness of 80 μm to produce electric contact material according to the first of the inventive production methods.

Comparative example 12

Similarly to the inventive example 55, a film of TiN

TABLE 6

| Example | Contacting resistance (mΩ) | Temperature rise (°C.) | Number of works at which cumulative failure rate becomes over 50% | Heat cycle test | Environmental resistance | | Cost |
|---|---|---|---|---|---|---|---|
| | | | | | Oxidation resistance | Corrosion resistance to organic gas | |
| Inventive example 43 | 7–10 | 38 | $5 \times 10^7$ | ◯ | ◯ | ◯ | Low |
| Inventive example 44 | 5–9 | 39 | $5 \times 10^7$ | ◯ | ◯ | ◯ | " |
| Inventive example 45 | 5–9 | 40 | $5 \times 10^7$ | ◯ | ◯ | ◯ | " |
| Comparative example 9 | 10–12 | 120 | $1 \times 10^5$ | ◯ | Δ | Δ | " |
| Comparative example 10 | 30 | 100 | $1 \times 10^6$ | ◯ | ◯ | ◯ | " |
| Comparative example 11 | 11–14 | 41 | $1 \times 10^7$ | ◯ | ◯ | ◯ | " |
| Inventive example 46 | 8–10 | 40 | $7 \times 10^7$ | ◯ | ◯ | ◯ | " |
| Inventive example 47 | 8–12 | 38 | $6 \times 10^7$ | ◯ | ◯ | ◯ | " |
| Inventive example 48 | 6–11 | 35 | $5 \times 10^7$ | ◯ | ◯ | ◯ | " |
| Inventive example 49 | 7–11 | 35 | $5 \times 10^7$ | ◯ | ◯ | ◯ | " |
| Inventive example 50 | 7–12 | 38 | $4 \times 10^7$ | ◯ | ◯ | ◯ | " |
| Inventive example 51 | 7–12 | 38 | $7 \times 10^7$ | ◯ | ◯ | ◯ | " |
| Inventive example 52 | 8–13 | 40 | $1 \times 10^8$ | ◯ | ◯ | ◯ | " |
| Inventive example 53 | 7–12 | 38 | $2 \times 10^8$ | ◯ | ◯ | ◯ | " |
| Inventive example 54 | 11–14 | 42 | $1 \times 10^7$ | ◯ | ◯ | ◯ | " |
| Conventional example 5 | 8–12 | 40 | $1 \times 10^5$ | Δ | ◯ | Δ | High |
| Conventional example 6 | 5–8 | 37 | $1 \times 10^6$ | ◯ | Δ | Δ | " |

As evident from Table 6, it can be seen that the fourth of the inventive materials shown in the inventive examples 43 through 53, wherein the layer of soft metal is provided on the surface of the covering layer of electric contact, exhibits equal contacting resistance, temperature rise, adhesion and environmental resistance to the first of the inventive materials shown in the inventive example 54, wherein said surface layer is not provided, and conventional materials and yet has far excellent life of contact.

was formed in a thickness of 200 Å to produce electric contact material.

Comparative example 13

Similarly to the inventive example 55, a film of TiN was formed in a thickness of 130 μm to produce electric contact material.

Comparative example 14

After performed the organic cleaning and electrolytic polishing using 52 Alloy as a substrate, a film of TiN was formed on one side thereof in a thickness of 1

μm similarly to the inventive example 1 without applying ion bombard to produce electric contact material.

Inventive example 58

After performed the organic cleaning and electrolytic polishing using 52 Alloy as a substrate, the surface was cleaned by applying ion bombard onto one side thereof with Ar in vacuum. Next, by using plasma CVD, making an atmosphere wherein 40 ml/s of hydrogen gas is flown as a carrier gas and, in addition to this, 2 ml/s of nitrogen gas and 0.5 ml/s of zirconium tetrachloride gas are flown as raw material gases, stabilizing the total pressure in the reactor to be 0.5 Torr, heating the substrate to a temperature of 700° C. and generating plasma by the use of direct current glow discharge at an output of 1.0 KW, a film of ZrN was formed in a thickness of 5 μm to produce electric contact material according to the first of the inventive production methods.

Inventive example 59

Similarly to the inventive example 58, by using plasma CVD, making an atmosphere wherein 40 ml/s of hydrogen gas is flown as a carrier gas and, in addition to this, 2 ml/s of nitrogen gas and 0.5 ml/s of hafnium tetrachloride gas are flown as raw material gases, stabilizing the total pressure in the reactor to be 0.5 Torr, heating the substrate to a temperature of 800° C. and generating plasma by the use of direct current glow discharge at an output of 1.0 KW, a film of HfN was formed in a thickness of 3 μm to produce electric contact material according to the first of the inventive production methods.

Inventive example 60

Similarly to the inventive example 58, a film of ZrN was formed by plasma CVD in a thickness of 2 μm and, thereon, a film of HfN was formed by plasma CVD similar to the inventive example 59 in a thickness of 1 μm to produce electric contact material according to the first of the inventive production methods.

Inventive example 61

Similarly to the inventive example 55, a film of TiN was formed by plasma CVD in a thickness of 0.5 μm and, thereon, a film of ZrN was formed by plasma CVD similar to the inventive example 58 in a thickness of 0.5 μm to produce electric contact material according to the first of the inventive production methods.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown Table 7.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ○ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ○ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ○ and mark Δ, respectively.

TABLE 7

| Example | Contacting resistance (mΩ) | Temperature rise (°C.) | Number of works at which cumulative failure rate becomes over 50% | Heat cycle test | Environmental resistance Oxidation resistance | Corrosion resistance to organic gas | Cost |
|---|---|---|---|---|---|---|---|
| Inventive example 55 | 11–14 | 42 | $1 \times 10^7$ | ○ | ○ | ○ | Low |
| Inventive example 56 | 10–13 | 43 | $1 \times 10^7$ | ○ | ○ | ○ | " |
| Inventive example 67 | 10–14 | 42 | $1 \times 10^7$ | ○ | ○ | ○ | " |
| Comparative example 12 | 60 | 120 | $1 \times 10^6$ | ○ | Δ | Δ | " |
| Comparative example 13 | 50 | 200 | $1 \times 10^5$ | ○ | ○ | ○ | " |
| Comparative example 14 | 13–17 | 50 | $1 \times 10^6$ | Δ | ○ | ○ | " |
| Inventive example 58 | 11–13 | 40 | $2 \times 10^7$ | ○ | ○ | ○ | " |
| Inventive example 59 | 10–13 | 38 | $2 \times 10^7$ | ○ | ○ | ○ | " |
| Inventive example 60 | 11–13 | 40 | $1 \times 10^7$ | ○ | ○ | ○ | " |
| Inventive example 61 | 10–13 | 45 | $2 \times 10^7$ | ○ | ○ | ○ | " |
| Conventional example 1 | 8–12 | 40 | $1 \times 10^5$ | Δ | Δ | Δ | High |
| Conventional example 2 | 5–8 | 37 | $1 \times 10^6$ | ○ | Δ | Δ | " |

As evident from Table 7, it can be seen that those according to the invention exhibit equal contacting resistance, temperature rise and adhesion to conventional examples and yet have far excellent life of contact and environmental resistance.

Whereas, with the comparative examples being out of the production conditions prescribed by the invention, it is seen that any one or more of contacting resistance, temperature rise, life of contact, adhesion and environmental resistance are poor leading to the unsuitability as a contact.

EXAMPLE 8

Inventive example 62

After performed the organic cleaning and electrolytic polishing using 52 Alloy as a substrate, the surface was cleaned by applying ion bombard onto one side thereof with Ar in vacuum equipment. Next, by flowing Ar and $N_2$ gases, making the pressure of Ar gas to be 10 mTorr and the pressure of $N_2$ gas to be 4 mTorr in the reactor, and heating the substrate to a temperature of 720° C., a film of ZrN was formed by direct current magnetron sputtering at an output of 500 W in a thickness of 1 μm to produce electric contact material according to the second of said inventive production methods.

Inventive example 63

Similarly to the inventive example 62, a film of ZrN was formed in a thickness of 10 μm to produce electric contact material according to the second of the inventive production methods.

Inventive example 64

Similarly to the inventive example 62, film of ZrN was formed in a thickness of 80 μm to produce electric contact material according to the second of the inventive production methods.

Comparative example 15

Similarly to the inventive example 62, film of ZrN was formed in a thickness of 200 Å to produce electric contact material.

Comparative example 16

Similarly to the inventive example 62, a film of ZrN was formed in a thickness of 130 μm to produce electric contact material.

Comparative example 17

After performed the organic cleaning and electrolytic polishing using 52 Alloy as a substrate, a film of ZrN was formed on one side thereof in a thickness of 1 μm similarly to the inventive example 62 without applying ion bombard treatment to produce electric contact material.

Inventive example 65

After performed the organic cleaning and electrolytic polishing using 52 Alloy as a substrate, the surface was cleaned by applying ion bombard onto one side thereof with Ar in vacuum. Next, by using a target of pure Ti, making the pressure in the reactor to be 10 mTorr under an atmosphere of gases at a flow rate of $N_2/(Ar+N_2)=0.5$, and heating the substrate to a temperature of 500° C., a film of TiN was formed by direct current magnetron sputtering at an output of 1 KW in a thickness of 5 μm to produce electric contact material according to the second of the inventive production methods.

Inventive example 66

After performed similar pretreatments using similar substrate to the inventive example 65, by using a target of pure Hf, making the pressure in the reactor to be 30 mTorr under an atmosphere of gases at a flow rate of $N_2/(Ar+N_2)=0.2$, and heating the substrate to a temperature of 800° C., a film of HfN was formed by high-frequency magnetron sputtering at an output of high-frequency of 500 W in a thickness of 3 μm to produce electric contact material according to the second of the inventive production methods.

Inventive example 67

After formed a film of TiN by direct current magnetron sputtering similarly to the inventive example 65 in a thickness of 0.5 μm, a film of ZrN was formed by direct current magnetron sputtering similarly to the inventive example 62 in a thickness of 0.5 μm to produce electric contact material according to the second of the inventive production methods.

Inventive example 68

After formed a film of ZrN by direct current magnetron sputtering similarly to the inventive example 65 in a thickness of 2 μm, a film of HfN was formed by high-frequency magnetron sputtering similarly to the inventive example 66 in a thickness of 1 μm to produce electric contact material according to the second of the inventive production methods.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 8.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ◯ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ◯ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ◯ and mark Δ, respectively.

TABLE 8

| Example | Contacting resistance (mΩ) | Temperature rise (°C.) | Number of works at which cumulative failure rate becomes over 50% | Heat cycle test | Environmental resistance Oxidation resistance | Environmental resistance Corrosion resistance to organic gas | Cost |
|---|---|---|---|---|---|---|---|
| Inventive example 62 | 11–14 | 42 | $1 \times 10^7$ | ◯ | ◯ | ◯ | Low |
| Inventive example 63 | 10–13 | 43 | $1 \times 10^7$ | ◯ | ◯ | ◯ | " |
| Inventive example 64 | 10–14 | 42 | $1 \times 10^7$ | ◯ | ◯ | ◯ | " |
| Comparative | 60 | 120 | $1 \times 10^5$ | ◯ | Δ | Δ | " |

TABLE 8-continued

| Example | Contacting resistance (mΩ) | Temperature rise (°C.) | Number of works at which cumulative failure rate becomes over 50% | Heat cycle test | Environmental resistance | | Cost |
|---|---|---|---|---|---|---|---|
| | | | | | Oxidation resistance | Corrosion resistance to organic gas | |
| example 15 | | | | | | | |
| Comparative example 16 | 50 | 200 | $1 \times 10^6$ | ◯ | ◯ | ◯ | " |
| Comparative example 17 | 13–17 | 50 | $1 \times 10^6$ | △ | ◯ | ◯ | " |
| Inventive example 65 | 11–13 | 40 | $2 \times 10^7$ | ◯ | ◯ | ◯ | " |
| Inventive example 66 | 10–13 | 38 | $2 \times 10^7$ | ◯ | ◯ | ◯ | " |
| Inventive example 67 | 11–13 | 40 | $1 \times 10^7$ | ◯ | ◯ | ◯ | " |
| Inventive example 68 | 10–13 | 45 | $2 \times 10^7$ | ◯ | ◯ | ◯ | " |
| Conventional example 1 | 8–12 | 40 | $1 \times 10^5$ | △ | △ | △ | High |
| Conventional example 2 | 5–8 | 37 | $1 \times 10^6$ | ◯ | △ | △ | " |

As evident from Table 8, it can be seen that those according to the invention exhibit equal contacting resistance, temperature rise and adhesion to conventional examples and yet have far excellent life of contact and environmental resistance.

Whereas, with the comparative examples being out of the production conditions prescribed by the invention, it is seen that any one or more of contacting resistance, temperature rise, life of contact, adhesion and environmental resistance are poor leading to the unsuitability as a contact.

EXAMPLE 9

Inventive example 69

After performed the organic cleaning and electrolytic polishing of the substrate of 52 Alloy as the pretreatments, surface cleaning was made on one side thereof by ion bombard with Ar in vacuum device. Then, a surface layer of ZrN was formed on the substrate heated to 720° C. by ion assist vaporization wherein, by using the equipment shown in FIG. 1, Zr is evaporated at a deposit rate of 500 Å/S and $N_2$ ions are irradiated onto the substrate from ion gun in a thickness of 1 μm to produce electric contact material according to the third of the inventive production methods. At this time, Ar/$N_2$ was made to be a ratio of about ½, gas pressure was kept at $1 \times 10^{-4}$ Torr, and Zr was evaporated by $CO_2$ laser.

Inventive example 70

By the same method as the inventive example 69, a surface layer of ZrN was formed in a thickness of 10 μm to produce electric contact material according to the third of the inventive production methods.

Inventive example 71

By the same method as the inventive example 69, a surface layer of ZrN was formed in a thickness of 80 μm to produce electric contact material according to the third of the inventive production methods.

Inventive example 72

By the same method as the inventive example 69, a surface layer of TiN was formed in a thickness of 5 μm to produce electric contact material according to the third of the inventive production methods.

Inventive example 73

By the same method as the inventive example 69, a surface layer of HfN was formed in a thickness of 3 μm to produce electric contact material according to the third of the inventive production methods.

Inventive example 74

By the same method as the inventive example 69, an intermediate layer of TiN was formed in a thickness of 0.5 μm and then a surface layer of ZrN was formed in a thickness of 0.5 μm to produce electric contact material according to the third of the inventive production methods.

Inventive example 75

By the same method as the inventive example 69, an intermediate layer of ZrN was formed in a thickness of 2 μm and then a surface layer of HfN was formed in a thickness of 1 μm to produce electric contact material according to the third of the inventive production methods.

Comparative example 18

By the same method as the inventive example 69, a surface layer of ZrN was formed in a thickness of 200 Å to produce electric contact material.

Comparative example 19

By the same method as the inventive example 69, a surface layer of ZrN was formed in a thickness of 130 μm to produce electric contact material.

Comparative example 20

After performed the organic cleaning and electrolytic polishing of the substrate of 52 Alloy as the pretreatments, a surface layer of ZrN was formed on the substrate heated to 720° C. by ion assist vaporization wherein Zr is evaporated by electron beam heating and $N_2$ ions are irradiated onto the substrate from ion gun in a thickness of 1 μm without carrying out the ion bombard treatment on one side of substrate with Ar to produce electric contact material. Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 9.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ○ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ○ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ○ and mark Δ, respectively.

to produce electric contact material according to the fourth of the inventive production methods.

Inventive example 78

By the same method as the inventive example 76, a surface layer of ZrN was formed in a thickness of 80 μm to produce electric contact material according to the fourth of the inventive production methods.

Inventive example 79

By the same method as the inventive example 76, a surface layer of TiN was formed in a thickness of 5 μm to produce electric contact material according to the fourth of the inventive production methods.

Inventive example 80

By the same method as the inventive example 76, a surface layer of HfN was formed in a thickness of 3 μm to produce electric contact material according to the

TABLE 9

| Example | Contacting resistance (mΩ) | Temperature rise (°C.) | Number of works at which cumulative failure rate becomes over 50% | Heat cycle test | Environmental resistance | | Cost |
| --- | --- | --- | --- | --- | --- | --- | --- |
| | | | | | Oxidation resistance | Corrosion resistance to organic gas | |
| Inventive example 69 | 10–13 | 40 | $1 \times 10^7$ | ○ | ○ | ○ | Low to medium |
| Inventive example 70 | 9–12 | 38 | $1 \times 10^7$ | ○ | ○ | ○ | Low to medium |
| Inventive example 71 | 10–13 | 40 | $1 \times 10^7$ | ○ | ○ | ○ | Low to medium |
| Inventive example 72 | 10–12 | 40 | $2 \times 10^7$ | ○ | ○ | ○ | Low to medium |
| Inventive example 73 | 9–11 | 38 | $2 \times 10^7$ | ○ | ○ | ○ | Low to medium |
| Inventive example 74 | 10–12 | 40 | $1 \times 10^7$ | ○ | ○ | ○ | Low to medium |
| Inventive example 75 | 10–13 | 45 | $2 \times 10^7$ | ○ | ○ | ○ | Low to medium |
| Comparative example 18 | 58 | 120 | $1 \times 10^5$ | ○ | Δ | Δ | Low to medium |
| Comparative example 19 | 47 | 200 | $1 \times 10^6$ | ○ | ○ | ○ | Low to medium |
| Comparative example 20 | 13–17 | 50 | $1 \times 10^6$ | Δ | ○ | ○ | Low to medium |
| Conventional example 1 | 8–12 | 40 | $1 \times 10^5$ | Δ | Δ | Δ | High |
| Conventional example 2 | 5–8 | 37 | $1 \times 10^6$ | ○ | Δ | Δ | " |

As can be seen from Table 9, those according to the invention exhibit approximately equal contacting resistance compared with those according to conventional method, but it can be seen that they are more excellent in the adhesion, environmental resistance and cost and have longer life of contact.

EXAMPLE 10

Inventive example 76

Figure 2:
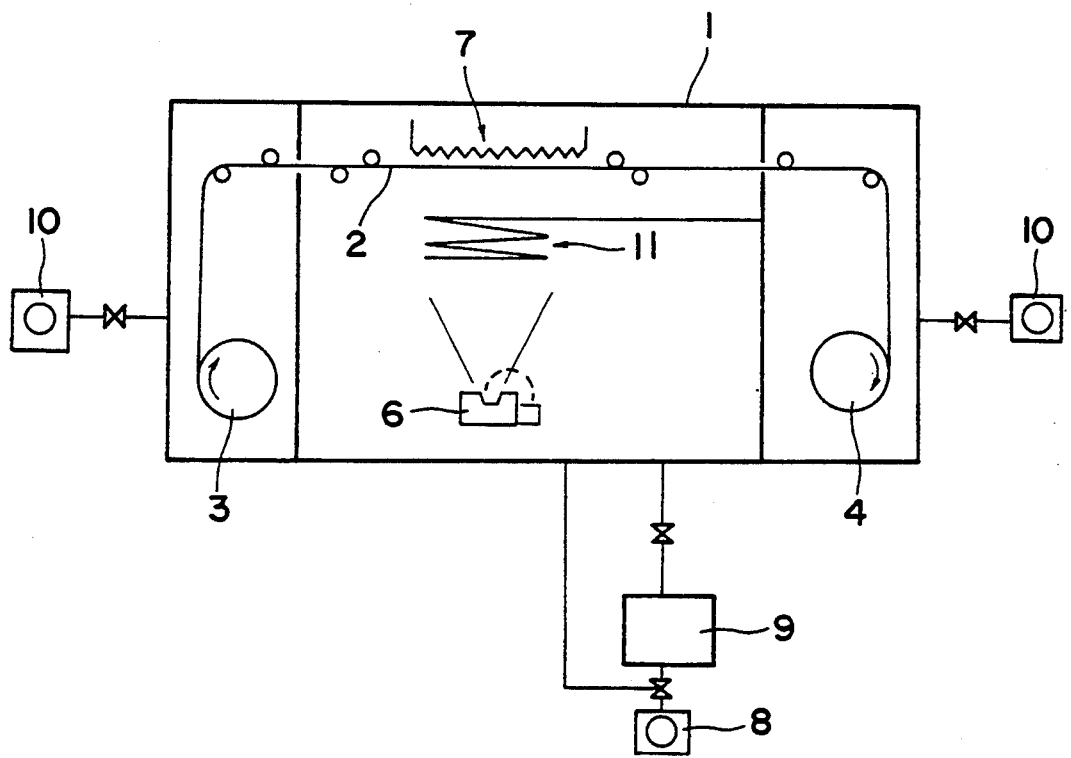
FIG. 2 is an illustration diagram showing one example of the constitution of equipment to practice the inventive method by ion blating.

After performed the organic cleaning and electrolytic polishing of the substrate of 52 Alloy as the pretreatments, surface cleaning was made on one side thereof by ion bombard with Ar in vacuum device. Then, a surface layer of ZrN was formed on the substrate heated to 720° C. by ion plating wherein, by using the equipment shown in FIG. 2, Zr is evaporated at a deposit rate of 500 Å/S and N₂ is ionized by the ionization mechanism comprising RF coil to irradiate onto the substrate in a thickness of 1 μm to produce electric contact material according to the fourth of said inventive production methods. At this time, Ar/N₂ was made to be a ratio of about ½, gas pressure was kept at $1 \times 10^{-4}$ Torr, and Zr was evaporated by CO₂ laser.

Inventive example 77

By the same method as the inventive example 76, a surface layer of ZrN was formed in a thickness of 10 μm fourth of the inventive production methods.

Inventive example 81

By the same method as the inventive example 76, an intermediate layer of TiN was formed in a thickness of 0.5 μm and then a surface layer of ZrN was formed in a thickness of 0.5 μm to produce electric contact material according to the fourth of the inventive production methods.

Inventive example 82

By the same method as the inventive example 76, an intermediate layer of ZrN was formed in a thickness of 1 μm and then a surface layer of HfN was formed in a thickness of 1 μm to produce electric contact material according to the fourth of the inventive production methods.

Comparative example 21

By the same method as the inventive example 76, a surface layer of ZrN was formed in a thickness of 200 Å to produce electric contact material.

Comparative example 22

By the same method as the inventive example 76, a surface layer of ZrN was formed in a thickness of 130 μm to produce electric contact material.

Comparative example 23

After performed the organic cleaning and electrolytic polishing of the substrate of 52 Alloy as the pretreatments, a surface layer of ZrN was formed on the substrate heated to 720° C. by ion plating wherein Zr is evaporated by electron beam heating and $N_2$ is ionized by multiarc discharge to irradiate onto the substrate in a thickness of 1 μm without carrying out the ion bombard treatment on one side of substrate with Ar to produce electric contact material. Besides, the flow ratio of Ar/$N_2$ was made to be ½ and the gas pressure was kept at $5 \times 10^{-4}$ Torr.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 10.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ○ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ○ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ○ and mark Δ, respectively.

TABLE 10

| Example | Contacting resistance (mΩ) | Temperature rise (°C.) | Number of works at which cumulative failure rate becomes over 50% | Heat cycle test | Environmental resistance | | Cost |
| --- | --- | --- | --- | --- | --- | --- | --- |
| | | | | | Oxidation resistance | Corrosion resistance to organic gas | |
| Inventive example 76 | 11–13 | 41 | $1 \times 10^7$ | ○ | ○ | ○ | Low to medium |
| Inventive example 77 | 10–12 | 39 | $1 \times 10^7$ | ○ | ○ | ○ | Low to medium |
| Inventive example 78 | 10–14 | 41 | $1 \times 10^7$ | ○ | ○ | ○ | Low to medium |
| Inventive example 79 | 11–13 | 40 | $2 \times 10^7$ | ○ | ○ | ○ | Low to medium |
| Inventive example 80 | 10–13 | 38 | $2 \times 10^7$ | ○ | ○ | ○ | Low to medium |
| Inventive example 81 | 11–13 | 40 | $1 \times 10^7$ | ○ | ○ | ○ | Low to medium |
| Inventive example 82 | 10–13 | 45 | $2 \times 10^7$ | ○ | ○ | ○ | Low to medium |
| Comparative example 21 | 59 | 120 | $1 \times 10^5$ | ○ | Δ | Δ | Low to medium |
| Comparative example 22 | 50 | 200 | $1 \times 10^6$ | ○ | ○ | ○ | Low to medium |
| Comparative example 23 | 13–17 | 50 | $1 \times 10^6$ | Δ | ○ | ○ | Low to medium |
| Conventional example 1 | 8–12 | 40 | $1 \times 10^5$ | Δ | Δ | Δ | High |
| Conventional example 2 | 5–8 | 37 | $1 \times 10^6$ | ○ | Δ | Δ | " |

As can be seen from Table 10, those according to the invention exhibit approximately equal contacting resistance compared with those according to conventional method, but it can be seen that they are more excellent in the adherion, environmental resistance and cost and have longer life of contact.

EXAMPLE 11

Inventive example 83

After performed the organic cleaning and electrolytic polishing using 52 Alloy as a substrate, the surface was cleaned on one side thereof by ion bombard with Ar in vacuum and, following this, an electric contact material according to the fifth of said inventive production methods was produced by laser beam sputtering method.

Namely, by using a target of ZrN, using $CO_2$ laser (wavelength 10.6 μm) with an output of 500 W as a beam source of oaser beam and KrF excimer laser (wavelength 248 nm with 30 W as an another beam source, sputtering the target with long-wavelength laser beam and irradiating short-wavelength laser beam to the group of particles thereof while heating the substrate plate to a temperature of 550° C., a film of ZrN was formed on the substrate plate in a thickness of 1 μm keeping the gas pressure of $N_2$ in the reactor at $10^{-4}$ Torr to produce inventive electric contact material.

Inventive example 84

Similarly to the inventive example 83, a film of ZrN was formed in a thickness of 10 μm to produce electric contact material according to the fifth of the inventive production methods.

Inventive example 85

Similarly to the inventive example 83, a film of ZrN was formed in a thickness of 80 μm to produce electric contact material according to the fifth of the inventive production methods.

Comparative example 24

Similarly to the inventive example 83, a film of ZrN was formed in a thickness of 200 Å to produce electric contact material.

Comparative example 25

Similarly to the inventive example 83, a film of ZrN was formed in a thickness of 130 μm to produce electric contact material.

Comparative example 26

Using 52 Alloy as a substrate, the organic cleaning and electrolytic polishing were performed, and, similarly to the inventive example 83, a film of ZrN was formed in a thickness of 1 μm without carrying out ion bombard on one side of substrate to produce electric contact material.

Inventive example 86

After performed the organic cleaning and electrolytic polishing using 52 Alloy as a substrate, the surface was cleaned on one side thereof by ion bombard with Ar in vacuum and, following this, an electric contact material was produced by laser beam sputtering method. Namely, by using a target of TiN, using $CO_2$ laser (wavelength 10.6 μm) with an output of 500 W, as a beam source of laser beam, making the gas pressure of $N_2$ in the reactor $10^{-4}$ Torr and heating the substrate to a temperature of 400° C. while next sputtering the target with beam and irradiating ultraviolet rays from xenon lamp to the group of particles, a film of TiN was formed in a thickness of 5 μm to produce electric contact material according to the fifth of the inventive production methods.

Inventive example 87

Similarly to the inventive example 86, an electric contact material was produced by laser beam sputtering method in the following way. Namely, by using a target of pure Hf, flowing $N_2$ gas and Ar gas at a flow ratio of $N_2/(Ar+N_2) = 0.3$ as an atmosphere, keeping the pressure in the reactor at $10^{-3}$ Torr, heating the substrate to a temperature of 800° C., using $CO_2$ laser (wavelength 10.6 μm) with an output of 500 W as a beam source of laser beam, sputtering the target with beam, and ionizing the sputtered particles and $N_2$ with RF coil installed between substrate and target, an electric contact material according to the fifth of the inventive production methods, a film of HfN being formed on the substrate in a thickness of 3 μm, was produced.

Inventive example 88

Similarly to the inventive example 86, a film of TiN was formed by laser beam sputtering method in a thickness of 0.5 μm and, thereon, a film of ZrN was formed by the same laser beam sputtering method in a thickness of 0.5 μm to produce electric contact material according to the fifth of the inventive production methods.

Inventive example 89

Similarly to the inventive example 86, a film of ZrN was formed by laser beam sputtering method in a thickness of 2 μm and, thereon, a film of HfN was formed by the same laser beam sputtering method in a thickness of 1 μm to produce electric contact material according to the fifth of the inventive production methods.

Making a switch S by cutting off the electric contact from said each electric contact material and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test, these results are shown in Table 11.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting, adherence, etc.

For the heat cycle test, heating of contact from room temperature to 400° C. was repeated 100 cycles to observe the externally appearing cracks in thin film of contact, and one without cracks and one with somewhat cracks were indicated by mark ○ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ○ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one with somewhat generation were indicated by mark ○ and mark Δ, respectively.

TABLE 11

| Example | Contacting resistance (mΩ) | Temperature rise (°C.) | Number of works at which cumulative failure rate becomes over 50% | Heat cycle test | Environmental resistance | | Cost |
|---|---|---|---|---|---|---|---|
| | | | | | Oxidation resistance | Corrosion resistance to organic gas | |
| Inventive example 83 | 11–14 | 42 | $1 \times 10^7$ | ○ | ○ | ○ | Low |
| Inventive example 84 | 10–13 | 43 | $1 \times 10^7$ | ○ | ○ | ○ | " |
| Inventive example 85 | 10–14 | 42 | $1 \times 10^7$ | ○ | ○ | ○ | " |
| Comparative example 24 | 60 | 120 | $1 \times 10^5$ | ○ | Δ | Δ | " |
| Comparative example 25 | 50 | 200 | $1 \times 10^6$ | ○ | ○ | ○ | " |
| Comparative example 26 | 13–17 | 50 | $1 \times 10^6$ | Δ | ○ | ○ | " |
| Inventive example 86 | 11–13 | 40 | $2 \times 10^7$ | ○ | ○ | ○ | " |
| Inventive example 87 | 10–13 | 38 | $2 \times 10^7$ | ○ | ○ | ○ | " |
| Inventive example 88 | 11–13 | 40 | $1 \times 10^7$ | ○ | ○ | ○ | " |
| Inventive example 89 | 10–13 | 45 | $2 \times 10^7$ | ○ | ○ | ○ | " |
| Conventional example 1 | 8–12 | 40 | $1 \times 10^5$ | Δ | Δ | Δ | High |
| Conventional | 5–8 | 37 | $1 \times 10^6$ | ○ | Δ | Δ | " |

TABLE 11-continued

| Example | Contacting resistance (mΩ) | Temperature rise (°C.) | Number of works at which cumulative failure rate becomes over 50% | Heat cycle test | Environmental resistance | | Cost |
| --- | --- | --- | --- | --- | --- | --- | --- |
| | | | | | Oxidation resistance | Corrosion resistance to organic gas | |
| example 2 | | | | | | | |

As evident from Table 11, it can be seen that those according to the invention exhibit-equal contacting resistance, temperature rise and adhesion to conventional examples and yet have for excellent life of contact and environmental resistance.

Whereas, with the comparative examples being out of the production conditions prescribed by the invention, it is seen that any one or more of contacting resistance, temperature rise, life of contact, adhesion and environmental resistance are poor leading to the unsuitability as a contact.

EXAMPLE 12

Inventive example 90

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 1 μm, and the contacting portion B was formed with $TiB_2$ by vaporization at a film-forming temperature of 600° C. in a thickness of 1 μm to produce the second of said inventive electric contacts.

Inventive example 91

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 0.5 μm, and the contacting portion B was formed with $TiB_2$ by vaporization at a film-forming temperature of 600° C. in a thickness of 0.5 μm and, thereon, with $ZrB_2$ by vaporization at a film-forming temperature of 600° C. in a thickness of 0.5 μm to produce the second of the inventive electric contacts.

Inventive example 92

Using 52 Alloy as a substrate, the organic cleaning, electrolytic polishing and ion bombard were performed as the pretreatments. The contacting portion A was formed with TiN by vaporization at a film-forming temperature of 500° C. in a thickness of 0.2 μm and, thereon, with ZrN by vaporization at a film-forming temperature of 500° C. in a thickness of 0.3 μm, and the contacting portion B was formed with TiN by vaporization at a film-forming temperature of 600° C. in a thickness of 0.2 μm and, thereon, with $TiB_2$ by vaporization at a film-forming temperature of 600° C. in a thickness of 0.3 μm to produce the second of the inventive electric contacts.

Inventive example 93

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 1 μm, and the contacting portion B was formed with Pt by sputtering at a film-forming temperature of 400° C. in a thickness of 0.2 μm to produce the second of the inventive electric contacts.

Inventive example 94

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 1 μm, and the contacting portion B was formed with Pd by sputtering at a film-forming temperature of 400° C. in a thickness of 0.2 μm to produce the second of the inventive electric contacts.

Inventive example 95

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 1 μm, and the contacting portion B was formed with Rh by sputtering at a film-forming temperature of 400° C. in a thickness of 0.2 μm to produce the second of the inventive electric contacts.

Inventive example 96

Using 52 Alloy as a substrate, the organic cleaning, electrolytic polishing and ion bombard were performed as the pretreatments. The contacting portion A was formed with ZrN by vaporization at a film-forming temperature of 400° C. in a thickness of 1 μm, and the contacting portion B was formed with ZrN by vaporization at a film-forming temperature of 500° C. in a thickness of 0.5 μm and, thereon, with Au by vaporization at 400° C. in a thickness of 0.2 μm to produce the second of the inventive electric contacts.

Inventive example 97

Using 52 Alloy as a substrate, the organic cleaning, electrolytic polishing and ion bombard were performed as the pretreatments. The contacting portion A was formed with TaC by vaporization at a film-forming temperature of 500° C. in a thickness of 1 μm, and the contacting portion B was formed with $ZrB_2$ by vaporization at a film-forming temperature of 600° C. in a thickness of 0.5 μm to produce the second of the inventive electric contacts.

Inventive example 98

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 10 μm, and the contacting portion B was formed with HfN by vaporization at a film-forming temperature of 500° C. in a thickness of 10 μm to produce the second of the inventive electric contacts.

Inventive example 99

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 10 μm, and the contacting portion B was formed with $TiB_2$ by vaporization at a film-forming temperature of 600° C. in a thickness of 1 μm to produce the second of the inventive electric contacts.

Inventive example 100

Using 52 Alloy as a substrate, the organic cleaning, electrolytic polishing and ion bombard were performed as the pretreatments. The contacting portion A was formed with ZrN by vaporization at a film-forming temperature of 500° C. in a thickness of 80 μm, and the contacting portion B was formed with TiB$_2$ by vaporization at a film-forming temperature of 600° C. in a thickness of 1 μm to produce the second of the inventive electric contacts.

Inventive example 101

Using 52 Alloy as a substrate, the organic cleaning, electrolytic polishing and ion bombard were performed as the pretreatments. The contacting portion A was formed with Zrn by vaporization at a film-forming temperature of 500° C. in a thickness of 0.05 μm, and the contacting portion B was formed with TiB$_2$ by vaporization at a film-forming temperature of 600° C. in a thickness of 1 μm to produce the second of the inventive electric contacts.

Inventive example 102

Using 52 Alloy as a substrate, the organic cleaning, electrolytic polishing and ion bombard were performed as the pretreatments. Both the contacting portion A and the contacting portion B were formed with ZrN by vaporization at a film-forming temperature of 500° C. in a thickness of 1 μm to produce the first of the inventive electric contacts.

Conventional example 7

Using 52 Alloy as a substrate, the organic cleaning and electrolytic polishing were performed as the pretreatments. Both the contacting portion A and the contacting portion B were formed with Au by chemical plating in a thickness of 1 μm and, thereon, a film of Rh was formed by chemical plating in a thickness of 2 μm to produce conventional electric contact.

Inventive example 103

Using 52 Alloy as a substrate, the organic cleaning, electrolytic polishing and ion bombard were performed as the pretreatments. Both the contacting portion A and the contacting portion B were formed with TiB$_2$ by vaporization at a film-forming temperature of 600° C. in a thickness of 1 μm to produce the first of the inventive electric contacts.

Making the electric contact each comprising said contacting portions A and B switch S and intervening cable C and resistance R (500 Ω), a circuit connected said switch S to electric source E (50 V) was constructed as shown in FIG. 3 and the contacting resistance, temperature rise and number of works at which cumulative failure rate becomes over 50% were determined. Moreover, the environmental resistance was examined together with heat cycle test. These results are shown in Table 12.

For the contacting resistance, temperature rise and number of works at which cumulative failure rate becomes over 50%, 100 mA current was turned on through the switch circuit shown in FIG. 3 to turn on and off, and the contacting resistance and temperature rise on closing were determined together with the examination of the number of works at which cumulative failure rate becomes over 50% due to melting adherence, etc.

For the heat cycle test, heating of contact from room temperature to 400° C. was repeated 100 cycles to observe the externally appearing cracks in thin film of contact, and one without cracks and one with somewhat cracks were indicated by mark ◯ and mark Δ, respectively.

The environmental resistance was examined on oxidation resistance and corrosion resistance to organic gas. As for the oxidation resistance, the contact was allowed to stand for 50 hours in an atmosphere of 400° C. to observe the extent of oxidation from the situation of surface, and one little oxidized and one somewhat oxidized were indicated by mark ◯ and mark Δ, respectively. Moreover, as for the corrosion resistance to organic gas, the contact was allowed to stand for 50 hours in an atmosphere of 400° C. to observe the extent of generation of organic polymer from the situation of surface, and one without generation and one wish somewhat generation were indicated by mark ◯ and mark Δ, respectively.

TABLE 12

| Example | Contacting resistance (mΩ) | Temperature rise (°C.) | Number of works at which cumulative failure rate becomes over 50% | Heat cycle test | Environmental resistance | | Cost |
|---|---|---|---|---|---|---|---|
| | | | | | Oxidation resistance | Corrosion resistance to organic gas | |
| Inventive example 90 | 11–14 | 42 | 7 × 10$^7$ | ◯ | ◯ | ◯ | Low |
| Inventive example 91 | 12–15 | 45 | 8 × 10$^7$ | ◯ | ◯ | ◯ | " |
| Inventive example 92 | 12–15 | 45 | 1 × 10$^8$ | ◯ | ◯ | ◯ | " |
| Inventive example 93 | 10–13 | 40 | 3 × 10$^7$ | ◯ | ◯ | Δ | " |
| Inventive example 94 | 10–13 | 40 | 3 × 10$^7$ | ◯ | ◯ | Δ | " |
| Inventive example 95 | 11–14 | 40 | 5 × 10$^7$ | ◯ | Δ | Δ | " |
| Inventive example 96 | 8–13 | 38 | 3 × 10$^7$ | ◯ | ◯ | ◯ | " |
| Inventive example 97 | 13–15 | 45 | 7 × 10$^7$ | ◯ | ◯ | ◯ | " |
| Inventive example 98 | 11–14 | 42 | 7 × 10$^7$ | ◯ | ◯ | ◯ | " |
| Inventive example 99 | 10–13 | 40 | 7 × 10$^7$ | ◯ | ◯ | ◯ | " |
| Inventive example 100 | 12–15 | 45 | 6 × 10$^7$ | ◯ | ◯ | ◯ | " |
| Inventive example 101 | 15–18 | 55 | 5 × 10$^7$ | ◯ | ◯ | ◯ | " |
| Inventive example 102 | 11–14 | 42 | 1 × 10$^7$ | ◯ | ◯ | ◯ | " |
| Inventive example 103 | 9–12 | 40 | 2 × 10$^7$ | ◯ | ◯ | ◯ | " |
| Conventional example 7 | 5–8 | 37 | 1 × 10$^6$ | ◯ | ◯ | Δ | High |

As evident from Table 12, it can be seen that the second of the inventive electric contacts shown in the inventive examples 90 through 101, wherein the contacting portions A and B are constituted by forming films of contact with different material quality on the substrate, has improved life of contact over the first of the inventive electric contacts shown in the inventive examples 102 and 103, wherein the contacting portions A and B are constituted by forming films of contact with the same material quality on the substrate, and conventional electric contact.

Utilizability in the industry

As described, in accordance with the invention, the electric contacts being low in cost and having good environmental resistance and characteristics of contact can be obtained and, in particular, the life as an electric contact and the reliability can be enhanced. For these and other reasons, the invention is useful industrially.

We claim:

1. An electric contact material characterized in that an intermediate layer of 0.03 to 100 μm thickness comprising two or more layers of at least not less than two kinds of materials selected from carbides, nitrides, borides, silicides and aluminides of Ti, Zr, Hf, V, Nb, Ta, Cr, Mo and W as a major ingredient is formed on a substrate as an electric contact and, further, a surface layer of not less than 0.01 μm thickness comprising at least one selected from Al, Co, Cu, Fe, Mg, Ni and Sr as a major ingredient thereon.

2. An electric contact material characterized in that an intermediate layer of 0.03 to 100 μm thickness comprising at least one selected from carbides, nitrides, borides, silicides and aluminides of Ti, Zr, Hf, V, Nb, Ta, Cr, Mo and W as a major ingredient is formed on a substrate as an electric contact and, further, a surface layer of not less than 0.01 μm thickness comprising at least one selected from Al, Co, Cu, Fe, Mg, Ni and Sr as a major ingredient thereon, wherein said surface layer does not contain a noble metal.

3. An electric contact material characterized in that an intermediate layer of 0.03 to 100 μm thickness comprising at least one selected from carbides, nitrides, borides, silicides and aluminides of Ti, Zr, Hf, V, Nb, Ta, Cr, Mo and W as a major ingredient is formed on a substrate as an electric contact and, further, a surface layer of not less than 0.01 μm thickness comprising at least one selected from Al, Co, Cu, Fe, Mg, Ni and Sr as a major ingredient thereon, wherein said surface layer comprises at least one selected from Al, Co, Fe, Mg, Ni and Sr as a major ingredient.

* * * * *

UNITED STATES PATENT AND TRADEMARK OFFICE
CERTIFICATE OF CORRECTION

PATENT NO. : 5,409,762
DATED : April 25, 1995
INVENTOR(S) : Masanori Ozaki, et al.

It is certified that error appears in the above-indentified patent and that said Letters Patent is hereby corrected as shown below:

On the title page, Item [63], and Column 1, Lines 6-10, the Related U.S. Application Data should read:

--Continuation-in-part of Ser. No. 623,647, Dec. 21, 1990, pending, filed as International Appln. No. PCT/JP90/00589, May 9, 1990--

Signed and Sealed this

Twenty-sixth Day of March, 1996

Attest:

BRUCE LEHMAN

*Attesting Officer*    *Commissioner of Patents and Trademarks*